United States Patent [19]
Shiraishi

[11] Patent Number: 5,467,166
[45] Date of Patent: Nov. 14, 1995

[54] PROJECTION EXPOSURE METHOD AND APPARATUS

[75] Inventor: Naomasa Shiraishi, Kawasaki, Japan

[73] Assignee: Nikon Corporation, Tokyo, Japan

[21] Appl. No.: 288,074

[22] Filed: Aug. 10, 1994

[30] Foreign Application Priority Data

Aug. 13, 1993 [JP] Japan ................. 5-201650

[51] Int. Cl.$^6$ .................. G03B 27/72; G03B 27/42
[52] U.S. Cl. .................. 355/71; 355/53
[58] Field of Search .................. 355/53, 67, 71

[56] References Cited

U.S. PATENT DOCUMENTS

| | | | |
|---|---|---|---|
| 4,992,825 | 2/1991 | Fukuda et al. | 355/53 |
| 5,208,629 | 5/1993 | Matsuo et al. | 355/53 |
| 5,323,208 | 6/1994 | Fukuda et al. | 355/53 |
| 5,329,333 | 7/1994 | Noguchi et al. | 355/53 |
| 5,348,837 | 9/1994 | Fukuda et al. | 430/269 |
| 5,379,090 | 1/1995 | Shiraishi | 355/67 |

FOREIGN PATENT DOCUMENTS

| | | |
|---|---|---|
| 62-50811 | 10/1987 | Japan . |
| 4-101148 | 4/1992 | Japan . |
| 4-225358 | 8/1992 | Japan . |

*Primary Examiner*—Richard A. Wintercorn
*Attorney, Agent, or Firm*—Shapiro and Shapiro

[57] ABSTRACT

In order to effect projection exposure at a great depth of focus without spoiling transfer fidelity even for a plurality of isolated patterns relatively close to one another, provision is made of a coherence reducing member CCM for reducing the coherency between imaging light in a central circular transmitting portion FA on or near the pupil plane (Fourier transform plane) of a projection optical system and imaging light in a marginal zonal transmitting portion FB, and a double focalizing member DFM for making the in-focus position of light passing through the circular transmitting portion FA and the in-focus position of light passing through the zonal transmitting portion FB differ in the direction of the optical axis of the projection optical system.

8 Claims, 20 Drawing Sheets

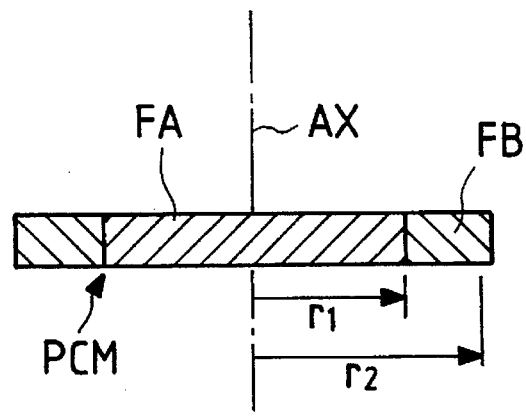
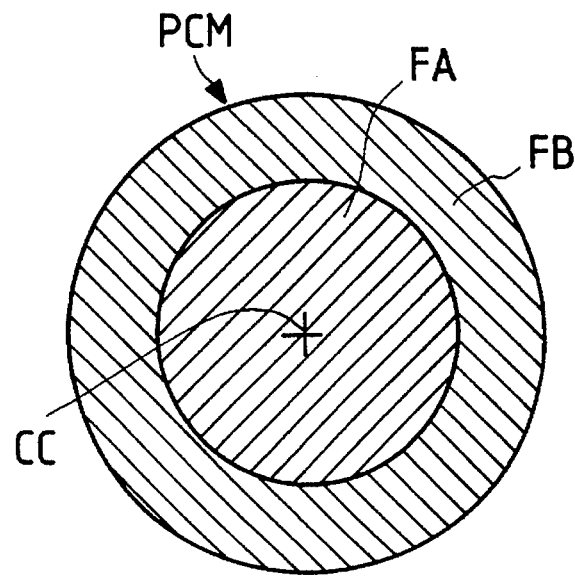
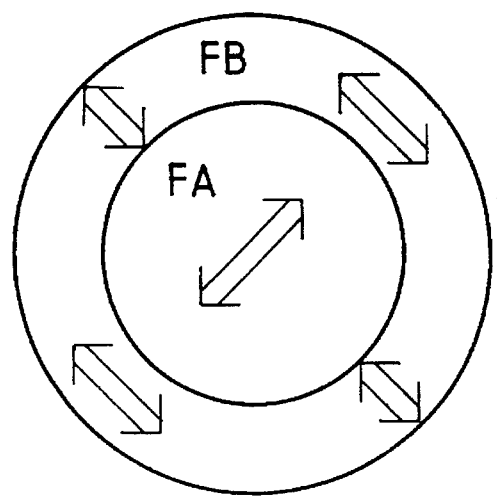

+1μm DEFOCUS POSITION

BEST FOCUS POSITION

-1μm DEFOCUS POSITION

+1μm DEFOCUS POSITION

BEST FOCUS POSITION

−1μm DEFOCUS POSITION

PRIOR ART EXPOSING METHOD

+1μm DEFOCUS POSITION

BEST FOCUS POSITION

-1μm DEFOCUS POSITION

PRIOR ART FLEX METHOD
FIG. 19A
+1μm DEFOCUS POSITION
FIG. 19B
BEST FOCUS POSITION
FIG. 19C
−1μm DEFOCUS POSITION
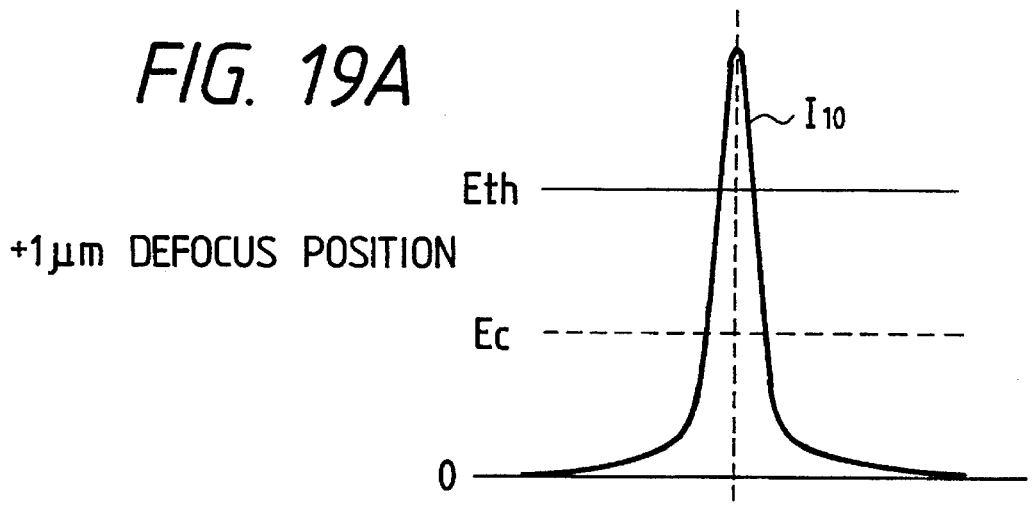
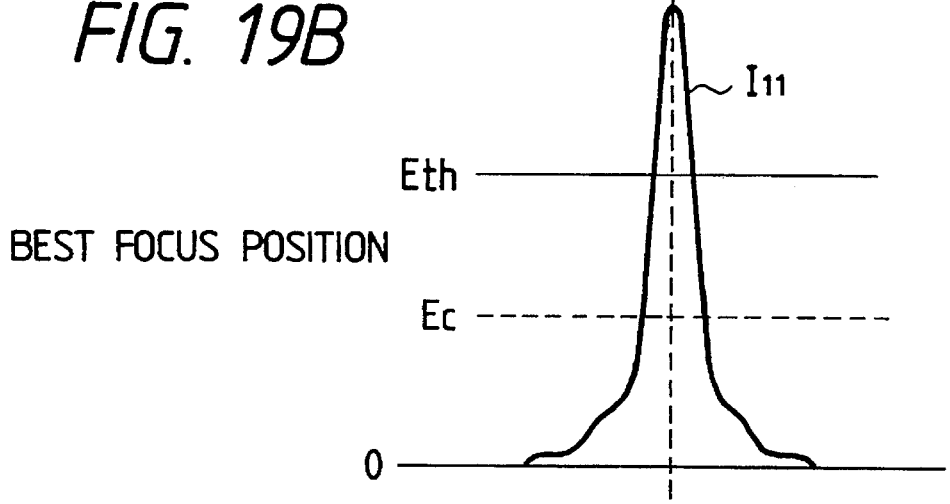

PROJECTION EXPOSURE METHOD AND APPARATUS

BACKGROUND OF THE INVENTION

1. Field of the Invention

This invention relates to a projection exposure apparatus for use when for example, the minute pattern of a semiconductive element, a liquid crystal display element or a thin film magnetic head is to be formed.

2. Related Background Art

A projection optical system for use in a projection exposure apparatus is incorporated into the apparatus by way of the super-precise working of a glass material and precise assembling and adjusting steps. Nowadays, in the manufacturing process for semiconductive integrated circuits or the like, use is made of a stepper in which a reticle (a mask) is illuminated with the i-ray (wavelength 365 nm) of a mercury lams as illuminating light and light transmitted through a circuit pattern on the reticle is imaged on a photosensitive substrate (a wafer or the like to which photoresist is applied) through the projection optical system. Also, for evaluation or research, use is made of a so-called excimer stepper which uses an excimer laser (such as a KrF laser of wavelength 48 nm) as illuminating light. In a projection optical system for the excimer stepper, when it is constructed of only a refracting lens, usable glass materials are limited to quartz, fluorite, etc.

Generally, to transform a minute reticle pattern faithfully to a photosensitive substrate by exposure using a projection optical system, the resolving power and depth of focus (DOF) of the projection optical system are important factors. Among projection optical system which have been put into practical use, there is one for i-ray which has a numerical aperture (NA) of the order of 0.6. When the wavelengths of illuminating lights used are the same, if the numerical aperture of the projection optical system is made great, the resolving power thereof will be correspondingly improved. However, the depth of focus (DOF) decreases with an increase in the numerical aperture (NA). When the wavelength of illuminating light is $\lambda$, the depth of focus is defined as $DOF = \pm \lambda / NA^2$.

FIG. 1 of the accompanying drawings schematically shows the imaging optical path of a projection optical system according to the prior art, and the projection optical system is comprised of a lens system GA as a front group and a lens system GB as a rear group. As the projection optical system of this kind, one in which both of the reticle R side and the wafer W side are made telecentric or one in which only the wafer W side is made telecentric is popular.

Now, in FIG. 1, suppose any three points A, B and C on the pattern surface of a reticle R (the object surface of the projection optical system). Of rays of light L1, L2, L3, La, La' and La" travelling in various directions from the point A, the ray of light L1 is created at such an angle that it cannot enter the lens system GA as the front group. Also, of the rays of light which have entered the lens system GA as the front group, the rays of light L2 and L3 cannot pass through a pupil ep located on a Fourier transform plane FTP in the projection optical system. On the other hand, the other rays of light La, La' and La" pass through the pupil ep into the lens system GB as the rear group, and are converged at a point A' on the surface of a wafer W (the image plane of the projection optical system). Accordingly, of the rays of light created from the point A on the reticle R, the rays of light passed through the pupil ep a circular area centering around an optical axis AX) of the projection optical system contribute to form a point image at a point A'. Here, of the rays of light travelling from the point A toward the point A', the ray of light La passing through the center point CC (a position on the optical axis) of the pupil ep is called the principal ray, which is parallel to the optical axis AX in the spaces on the object surface side and the image plane side, in the case of a projection optical system in which both sides are telecentric.

This also holds true of the rays of light created from the points B and C on the reticle R, and only the rays of light passed through the pupil ep contribute to the formation of point images B' and C'. Likewise, rays of light Lb and Lc travelling from the points B and C, respectively, in parallel to the optical axis AX and entering the lens system GA both become principal rays passing through the center point CC of the pupil ep. Thus, the pupil ep is in Fourier transform and reverse Fourier transform relations with the pattern surface of the reticle R and the surface of the wafer W, respectively, and of the rays of light from the pattern on the reticle R, all of the rays of light which contribute to imaging pass through the pupil ep while being superposed one upon another.

The numerical aperture of such a projection optical system is generally represented as the wafer side value. In FIG. 1, of the rays of light contributing to the formation of the point image A', the angle $\theta_w$ the rays of light La' and La" passing through the outermost portion of the pupil ep form with the principal ray La on the wafer W corresponds to the numerical aperture NAw on the wafer (image plane) side of this projection optical system, and NAw is expressed as $NAw = \sin\theta w$. Accordingly, the angle $\theta r$ the rays of light La' and La" form with the principal ray La on the reticle R side corresponds to the numerical aperture NAr on the reticle (object surface) side, and NAr is expressed as $NAr = \sin\theta r$. Further, when the imaging magnification of the projection optical system is 1/M (in the case of 1/5 reduction, M=5), there is the relation that $M \cdot NAr = NAw$.

Now, to enhance the resolving power, the numerical aperture NAw (NAr) can be made great, and this is nothing but making the diameter of the pupil ep, i.e., the effective diameters of the lens systems GA and GB, great. Also, the depth of focus DOF decreases in inverse proportion to the square of the numerical aperture NAw and therefore, even if a projection optical system of high numerical aperture could be manufactured, the necessary depth of focus would not be obtained, and this would be a great hindrance in practical use. When for example, the wavelength of the illuminating light is 365 nm and the numerical aperture NAw is 0.6, the depth of focus DOF is about 1 μm (±0.5 μm) in terms of width. Thus, unsatisfactory resolution will be caused in a portion of a shot area (about 20 mm–30 mm square) on the wafer in which the unevenness or curvature of the surface is greater than DOF. Further, there will arise the necessity of effecting the focusing, levelling, etc. for each shot area particularly highly accurately and thus, the burden of a mechanical system, an electrical system and software (the effort to improve measurement resolving power, servo control accuracy, set time, etc.) will increase.

So, the applicant proposed in Japanese Laid-Open Patent Application No. 4-101148, Japanese Laid-Open Patent Application No. 4-22535, etc. A new projection exposure technique which can obtain both of high resolving power and a great depth of focus without using the phase shift reticle disclosed in Japanese Patent Publication No. 62-50811. This exposure technique uses the existing projection optical system to control the illuminating method for a reticle into a special form to thereby increase the resolving power and the depth of focus, and is called SHRINC (Super High Resolution by Illumination Control) method. SHRINC method applies illuminating light to a line and space pattern (L&S pattern) on a reticle at an angle, and passes 0-order diffracted light component and one of ±1st-order diffracted light components symmetrically with respect to the center point CC in the pupil ep of the projection optical system, and utilizes the principle of the interference between two beams of light (the interference between one 1st-order diffracted light and 0-order diffracted light) to produce the projected image (interference fringe) of the L&S pattern. According to imaging which utilizes the interference between two beams of light, the occurrence of wave front aberration during defocus is suppressed more than in the prior art (vertical illumination) and therefore, the depth of focus becomes great.

However, SHRINC method can obtain its intended effect when the pattern formed on the reticle, like L&S pattern (grating), has periodic structure, and cannot obtain its effect for an isolated pattern such as a contact hole. Generally, in the case of an isolated minute pattern, diffracted light therefrom is created as Fraunhofer's diffraction almost uniform with respect to the angle of diffraction. Therefore, in the pupil of the projection optical system, the diffracted light is not distinctly separated into 0-order diffracted light and higher-order diffracted light, but is distributed substantially uniformly.

So, as an exposure method for enlarging the apparent depth of focus for an isolated pattern such as a contact hole, a method of dividing exposure for a shot area into a plurality of cycles and moving a wafer by a predetermined amount in the direction of the optical axis during each cycle of exposure was proposed, for example, in U.S. Pat. No. 4,992,825. This exposure method is called FLEX (Focus Latitude Enhancement Exposure) method, and can obtain a sufficient depth of focus enlarging effect for an isolated pattern such as a contact hole. However, FLEX method makes it requisite to multiplexly expose a slightly defocused contact hole image and therefore, the resist image obtained after development necessarily becomes reduced in sharpness. The problem of this reduction in sharpness (the aggravation of profile) can be made up for by the use of resist of a high gamma value, by the use of multilayer resist or by the use of CEL (Contrast Enhancement Layer).

Also, as an attempt to enlarge the depth of focus during the projection of a contact hole pattern without moving a wafer in the direction of the optical axis during the exposing operation as in FLEX method, there is known Super-FLEX method announced in the collection of papers $29a$ - ZC - 8 and 9 of the meeting of the Applied Physical Society, spring, 1991. Super-FLEX method provides a transparent phase plate (the phase difference being $\pi$ [rad]) in the pupil of a projection optical system, and provides such a characteristic that the complex amplitude transmittance given to imaging light by this phase plate sequentially varies from the optical axis toward the marginal portion.

In the prior art described above, FLEX method and Super-FLEX method can obtain a sufficient depth of focus increasing effect for an isolated contact hole pattern. However, for a plurality of contact hole patterns which are close to one another to a certain degree, there is a problem that unnecessary film decrease is caused in the photoresist between the contact holes. Also, FLEX method in which a wafer is continuously moved in the direction of the optical axis during the exposing operation is difficult to apply to an exposure apparatus of the scanning exposure type. Further, FLEX method in which exposure to a shot area is divided into first exposure and second exposure and during each exposing operation, a wafer is moved by a predetermined amount in the direction of the optical axis suffers from the inconvenience that the reduction in the processing ability is great and throughput is remarkably reduced.

SUMMARY OF THE INVENTION

It is the object of the present invention to provide a projection exposure apparatus in which the depth of focus is enlarged during the projection exposure of an isolated pattern such as a contact hole pattern, and particularly a projection exposure apparatus which can obtain a depth of focus enlarging effect without spoiling transfer fidelity even for a plurality of isolated patterns which are relatively close to one another.

The projection exposure apparatus according to the present invention is provided with an illuminating system for irradiating a mask with illuminating light, a projection optical system for projecting the image of a pattern formed on the mask onto a photosensitive substrate, a coherence reducing member for reducing the coherency between imaging light distributed in a first area comprising at least one of a circular area centering around the optical axis of the projection optical system on or near an optical Fourier transform plane in the projection optical system for the pattern surface of the mask and a zonal area and imaging light distributed in a second area on or near the Fourier transform plane other than the first area, and a double focalizing member for making the in-focus position of light passing through the first area and the in-focus position of light passing through the second area different in the direction of the optical axis of the projection optical system.

An example of the double focalizing member is an optical element in which the focal length of the first area and the focal length of the second area differ from each other. Another example of the double focalizing member is a phase difference member for making the phase of light passing through an axis-symmetrical partial area in the first area centering around the optical axis of the projection optical system differ by the order of $\pi/2$ [rad] from the phase of light passing through the other area than the partial area in the first area. Further, the double focalizing member may be a phase difference member for making the phase of light passing through the axis-symmetrical partial area in the second area centering around the optical axis of the projection optical system differ by the order of $\pi/2$ [rad] from the phase of light passing through the other area than the partial area in the second area.

An example of the coherence reducing member is a polarized state varying member for setting the polarized state of light passing through the first area and the polarized state of light passing through the second area to a state in which they do not interfere with each other. Another example of the coherence reducing member is an optical path difference member for providing between the light passing through the first area and the light passing through the second area an optical path difference equal to or greater than the coherent distance of the light.

Also, in the present invention, when the amount of deviation in the direction of the optical axis of the projection optical system between the in-focus position of the light passing through the first area and the in-focus position of the light passing through the second area is $\Delta Ft2$ and the numerical aperture of the projection optical system is NA and the center wavelength of the illuminating light is $\lambda$, it is desirable that the amount of deviation $\Delta F_{12}$ satisfy the following condition:

$$1.6 \times \lambda/NA^2 \leq \Delta F_{12} \leq 3.2 \times \lambda/NA^2 \tag{1}$$

As described above, in the present invention, the coherence reducing member is provided on or near a plane in the projection optical system (hereinafter referred to as the pupil plane) which is optically in the relation of Fourier transform to the pattern surface of the mask (hereinafter referred to as the reticle), and imaging light distributed in the circular area and/or the zonal area in the pupil plane and imaging light distributed in the other area are brought into a state in which they do not interfere with each other. As a result, a beam of light (imaging light) transmitted through and diffracted particularly by the contact hole pattern on the reticle is spatially divided into two beams of light which do not interfere with each other in the pupil plane, and arrives at a substrate (hereinafter referred to as the wafer) which is an object to be exposed. On the wafer also, the two beams of light do not interfere with each other (are incoherent) and therefore, there is obtained a combined intensity image in which images created by the respective beams of light (the images of the contact hole pattern) are added together in terms of intensity. In contrast, in the prior art method, when the beams of light transmitted through and diffracted by the contact hole pattern arrive at the surface of the wafer via the projection optical system, they are combined together in terms of amplitude (coherent-added together) there, and a pattern image (an optical image) is formed. Again in the prior-art Super-FLEX method, the imaging light distributed in the pupil plane is merely partially phase-shifted, and this does not differ from coherent addition.

Now, assuming that a phase shift plate or the like is absent on the pupil plane of the projection optical system, in the best focus state (in-focus state), the optical path lengths from any one point on the reticle to corresponding image points on the wafer are all equal irrespective of the optical paths passing along which ray path in the projection optical system (Fermat's principle). Accordingly, the amplitude combination on the wafer becomes the combination of lights free of a phase difference, and acts in a direction to increase the intensity of the images of all contact hole patterns.

However, when the wafer is defocused, said optical path lengths differ depending on the ray path in the projection optical system. As a result, said amplitude combination becomes the addition of lights having an optical path difference (a phase difference) and an offsetting effect occurs partly, thus weakening the center intensity of the contact hole pattern. The optical path difference occurring at this time is expressed as nearly $(\frac{1}{2})(\Delta F \cdot \sin^2\theta)$ when the angle of incidence of any ray of light incident on an image point on the wafer is $\theta$ and the optical path length of a ray of light entering the wafer perpendicularly thereto (the principal ray) is the reference (0). Here, $\Delta F$ represents the defocus amount. The maximum value of $\sin\theta$ is the numerical aperture NAw on the wafer side of the projection optical system and therefore, when all lights of the diffracted light from the contact hole pattern which have passed through the pupil are amplitude-combined as in the prior art, an optical path difference of $(\frac{1}{2})(\Delta F \cdot NAw^2)$ at the maximum occurs. Assuming that at this time, up to an optical path difference of $\lambda/4$ is allowed as the depth of focus, there is established the following relation:

$$)\frac{1}{2})(\Delta F \cdot NAw^2) = \lambda/4 \tag{2}$$

Rearranging this expression (2), $\Delta F = \lambda/(2NAw^2)$, and this coincides with the generally said range of the depth of focus. For example, when the wavelength $\lambda$ of the illuminating light is 0.365 μm and the numerical aperture NAw is 0.50, the depth of focus $\pm \Delta F/2$ becomes $\pm 0.73$ μm, and this is a value having very little allowance for the process level difference (of the order of 1 μm) on the wafer.

On the other hand, in the present invention, as shown in FIGS. 2A and 2B of the accompanying drawings, a coherence reducing member CCM and a double focalizing member DFM are provided on the pupil plane (Fourier transform plane FTP) of the projection optical system. At this time, a beam of imaging light (of which the principal ray is LLp) diffracted by an isolated pattern Pr formed on the pattern surface of the reticle R enters the front group lens system GA of the projection optical system PL, whereafter it arrives at the Fourier transform plane FTP. In the Fourier transform plane FTP, beams of light transmitted through a circular transmitting portion FA in the central portion of the pupil and a zonal transmitting portion FB, respectively, are controlled (transformed) into a state in which they do not interfere with each other. Therefore, on the wafer W, the beam of light LFa transmitted through the circular transmitting portion FA of the coherence reducing member CCM and the beam of light LFb transmitted through the marginal transmitting portion FB do not interfere with each other. As a result, the beam of light LFa from the circular transmitting portion FA and the beam of light LFb from the marginal transmitting portion FB independently interfere with each other and form the image (intensity distribution) Pr' of the contact hole pattern. That is, what results from simply adding together the image formed on the wafer W by the interference of only the beam of light LFa and the image formed on the wafer W by the interference of only the beam of light LFb is the image Pr' of the isolated pattern obtained by the present invention.

Further, in the present invention, the double focalizing member is provided together with the coherence reducing member and therefore, in FIGS. 2A and 2B, the in-focus position (the best focus plane) of the image formed by the beam of light LFa and the in-focus position of the image formed by the beam of light LFb deviate from each other in the direction of the optical axis and a depth of focus enlarging effect similar to that of the prior-art FLEX method is obtained. Moreover, in the present invention, there is also the effect that the depth of focus of the image itself formed by each of the beams of light LFa and LFb increases.

So, the principle of imaging in the present invention will further be described with reference to FIGS. 3A and 3B of the accompanying drawings. FIGS. 3A and 3B schematically show the relations among the structure of the coherence reducing member CCM, the state of the beam of imaging light which forms the image Pr' of the contact hole pattern, and the optical path difference $\Delta Z$ between the beams of light during defocus.

As shown in FIG. 3A, in the amplitude combination by the beam of light LFa passing through the central portion, the beam of light LFa includes the angle range from the perpendicular incident light (principal ray LLp) to the angle of incidence $\theta_1$ and therefore, the maximum optical path difference $\Delta Z_1$ when the defocus amount is $\Delta F$ is as follows:

$$\Delta Z_1 = (\frac{1}{2})(\Delta F \cdot \sin^2\theta_1) \tag{3}$$

In FIGS. 3A and 3B, the axes of abscissas of the lowermost graphs represent the sine of the angle of incidence, $\sin\theta_1 = NA_1$. On the other hand, as shown in FIG. 3B, in the amplitude combination by the beam of light LFb passing through the marginal portion, the beam of light LFb has the angle-of-incidence range from the angle of incidence $\theta_1$ to the numerical aperture NAw ($=\sin\theta w$) and therefore, the maximum optical path difference $\Delta Z_2$ when the defocus amount is $\Delta F$ is as follows:

$$\Delta Z_2 = (\tfrac{1}{2})(\Delta F)(NAw^2 - \sin^2\theta_1) \quad (4)$$

Now, since the beam of light LFa and the beam of light LFb do not interfere with each other, the deterioration of the image $Pr'_1$ by the interference of only the beam of light LFa and the image $Pr'_2$ by the interference of only the beam of light LFb is attributable to only the optical path length differences $\Delta Z_1$ and $\Delta Z_2$ in the respective beams of light.

For example, $\sin\theta_1$ is set so that $\sin^2\theta_1 = (\tfrac{1}{2})(NAw^2)$. That is, when the radius of the circular transmitting portion FA is determined so as to substantially satisfy the relation that $$2\sin^2\theta_1 = NAw^2,$$

the maximum optical path difference $\Delta Z_1$ by the beam of light LFa and the maximum optical path difference $\Delta Z_2$ by the beam of light LFb are as follows:

$$\Delta Z_1 = (\tfrac{1}{2})(\Delta F \cdot \sin^2\theta_1) = (\tfrac{1}{4})(\Delta F \cdot NAw^2) \quad (5)$$

$$\Delta Z_2 = (\tfrac{1}{2})(\Delta F)(NAw^2 - \sin^2\theta_1) = (\tfrac{1}{4})(\Delta F \cdot NAw^2)$$

Thus, both of the two coherent beams of light LFa and LFb have substantially the same maximum optical path difference $(\tfrac{1}{4})(\Delta F \cdot NAw^2)$ during defocus. This value is half of the value in the case of the prior art. In other words, in the present invention, even if the defocus amount is $2 \times \Delta F$, there will only be required the same maximum optical path length difference as that when the defocus amount is $\Delta F$ in the prior art projection system. As a result, the depth of focus during the imaging of the isolated pattern Pr increases to about double. The technique of converting the beam of imaging light into a plurality of beams of light which do not interfere with one another in the pupil plane FTP of the projection optical system PL in this manner will hereinafter be called SFINCS (Spatial Filter for INCoherent Stream) method.

As described above, the depth of focus of the image of the isolated pattern such as the contact hole pattern is increased by SFINCS method. This is owing to the coherence reducing member disposed on the pupil plane of the projection optical system. Further, in the present invention, two coherent images having had their depths of focus enlarged by SFINCS method are shifted in the direction of the optical axis by the double focalizing member disposed on or near the pupil plane of the projection optical system and therefore, a greater depth of focus enlarging effect is obtained. Also, when the amount of deviation $\Delta F_{12}$ in the direction of the optical axis of the projection optical system between the in-focus position of the light passing through the first area and the in-focus position of the light passing through the second area satisfies the condition of expression (1), the depth of focus enlarging effect becomes especially great.

According to the present invention, provision is made of the coherence reducing member and the double focalizing member and therefore, the depth of focus during the projection of the isolated pattern such as the contact hole pattern can be enlarged to the same degree as FLEX method or Super-FLEX method. Further, there is an advantage that the photosensitive substrate need not be moved in the direction of the optical axis or vibrated as is done in FLEX method. Also, ringing (sub-peak) is liable to occur in SuperFLEX method, but it is suppressed sufficiently small in the present invention. Accordingly, a good imaging characteristic free of wrong transfer can be obtained even for a plurality of contact hole patterns relatively close to one another. Also, when the amount of deviation $\Delta F_{12}$ in the direction of the optical axis of the projection optical system between the in-focus position of the beam of light passing through the first area in or near the Fourier transform plane of the projection optical system and the in-focus position of the beam of light passing through the second area differing from the first area satisfies the relation that $1.6 \times \lambda / NA^2 \leq \Delta F_{12} \leq 3.2 \times \lambda / NA^2$, the depth of focus can be increased without resolving power being almost reduced.

BRIEF DESCRIPTION OF THE DRAWINGS

FIGS. 6A, 6B and 6C show an example of the construction of the coherence reducing member.

FIGS. 19A, 19B and 19C show the result of the simulation of the intensity distribution of an optical image obtained by projection-exposing a single contact hole pattern by FLEX method.

DESCRIPTION OF THE PREFERRED EMBODIMENTS

Figure 4:
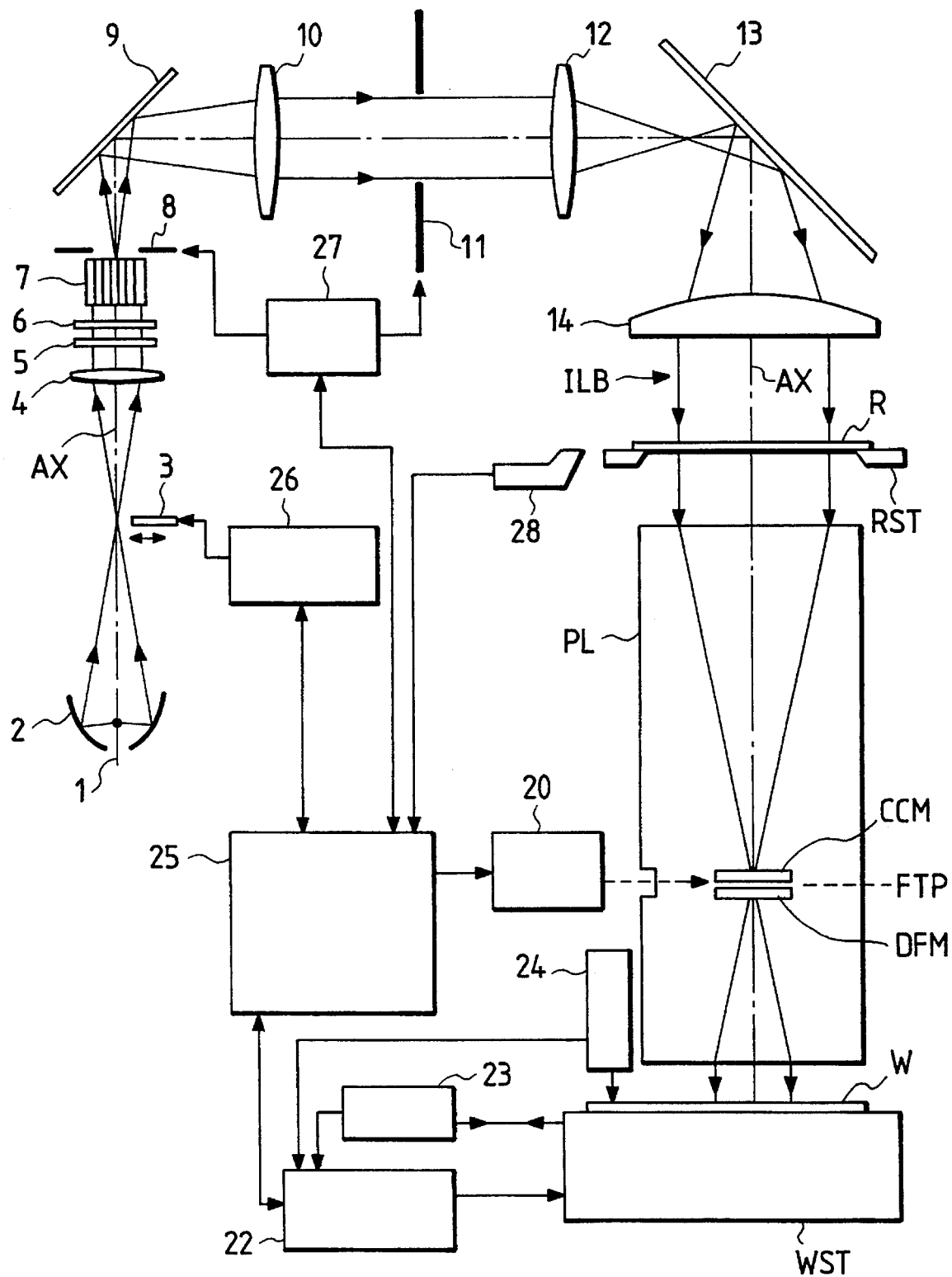
FIG. 4 shows the general construction of a projection exposure apparatus according to an embodiment of the present invention.

FIG. 4 shows the general construction of a projection exposure apparatus according to an embodiment of the present invention. In FIG. 4, high luminance light emitted from a mercury lamp 1 is converged at a second focus of an elliptical mirror 2 by the elliptical mirror 2, whereafter it becomes divergent light and enters a collimator lens 4. A rotary shutter 3 is disposed at the position of the second focus, and the passage and interception of the illuminating light are controlled by this rotary shutter 3. The illuminating light converted into a substantially parallel beam of light by the collimator lens 4 enters an interference filter 5, where only a desired spectrum, e.g. i-ray, is extracted. The illuminating light (i-ray) having emerged from the interference filter 5 passes through a polarization control member 6 for regularizing the direction of polarization, whereafter it enters an optical integrator (fly-eye lens) 7. The polarization control member 6 may be eliminated depending on the construction of a coherence reducing member CCM in a projection optical system PL and the nature of the light source, and this will be described later.

Now, the illuminating light having entered the fly-eye lens 7 is divided by a plurality of lens elements which constitute the fly-eye lens 7, and a secondary light source image (the image of the light emitting point of the mercury lamp 1) is formed on the emergence side of each lens element. Accordingly, the same number of point light source images as the number of the lens elements are distributed on the emergence side of the fly-eye lens 7, and a plane light source image is formed. A variable aperture stop ($\phi$ stop) 8 for adjusting the size of the plane light source image is provided on the emergence side of the fly-eye lens 7. The illuminating light passed through this aperture stop 8 is reflected by a mirror 9 and enters a condensing lens 10, whereafter it irradiates the rectangular opening portion of a variable field stop (reticle blind) 11 with substantially uniform illuminance. In FIG. 4, of the plurality of secondary light source images formed on the emergence side of the fly-eye lens 7, only the illuminating light from a secondary light source image located on an optical axis AX is typically shown. Also, by the condensing lens 10, the emergence side surface of the fly-eye lens 7 (the surface on which the secondary light source images are formed) is made into a Fourier transform plane for the rectangular opening surface of the reticle blind 11. Accordingly, the beams of light diverging from the plurality of secondary light source images on the fly-eye lens 7 and having entered the condensing lens 10 become parallel beams of light slightly differing in angle of incidence from one another on the reticle blind 11 and are superposed one upon another.

The illuminating light passed through the rectangular opening in the reticle blind 11 enters a condenser lens 14 via a lens system 12 and a mirror 13, and the light emerging from the condenser lens 14 becomes illuminating light ILB and arrives at a reticle R. The rectangular opening surface of the reticle blind 11 and the pattern surface of the reticle R are disposed conjugately with each other by the composite system of the lens system 12 and the condenser lens 14. Accordingly, the image of the rectangular opening in the reticle blind 11 is formed so as to substantially include a rectangular pattern forming area formed on the pattern surface (lower surface) of the reticle R. As shown in FIG. 4, of the secondary light source images on the fly-eye lens 7, the illuminating light ILB from a secondary light source image located on the optical axis AX is a parallel beam of light having no inclination with respect to the optical axis AX on the reticle R, and this is because the reticle side of the projection optical system PL is telecentric. Of course, a number of secondary light source images (off-axis point light sources) located off the optical axis AX are formed on the emergence side of the fly-eye lens 7, and the illuminating lights from them become parallel beams of light inclined with respect to the optical axis AX on the reticle R and are superposed one upon another in the pattern forming area.

Figure 1:
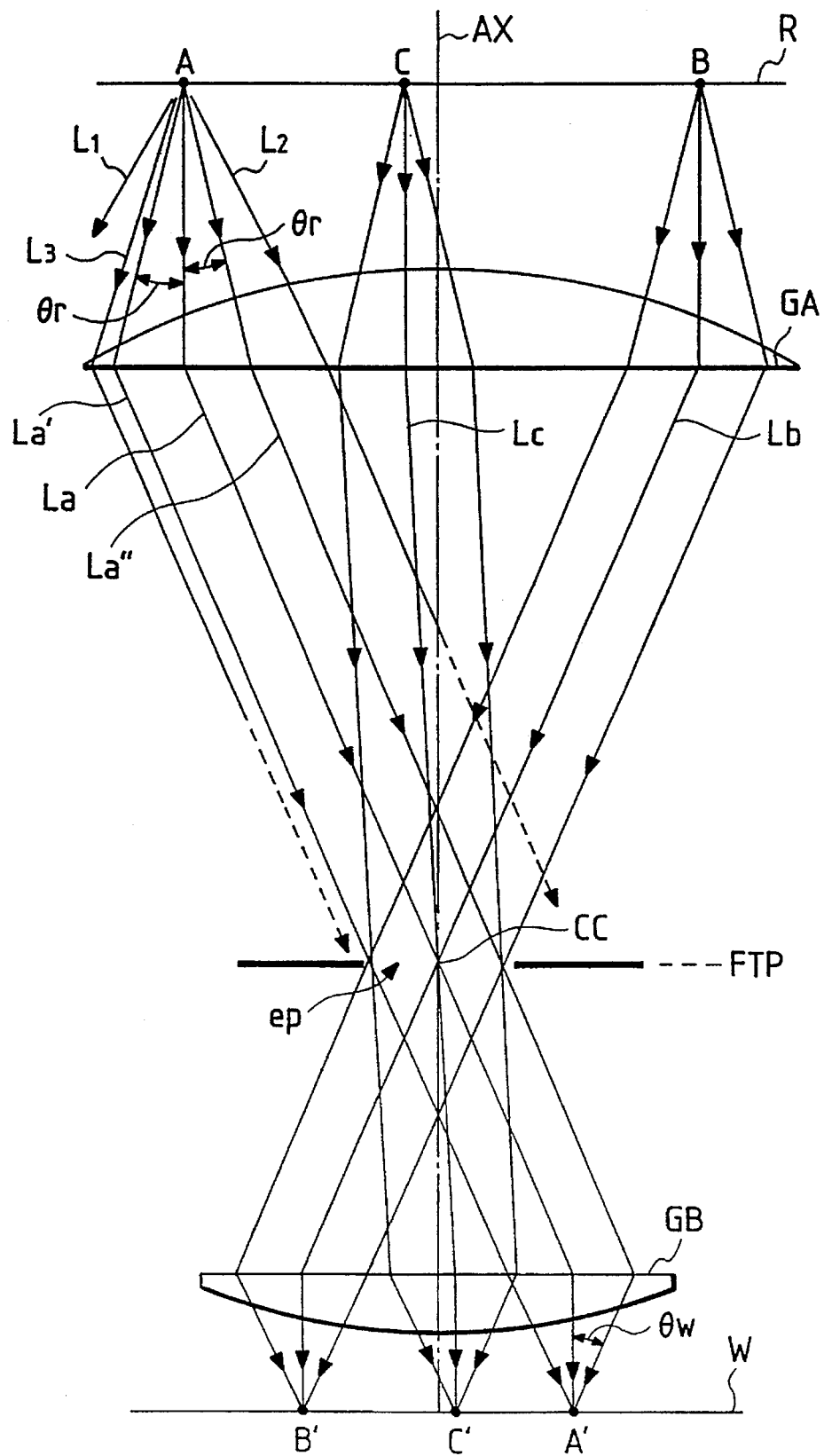
FIG. 1 illustrates an ordinary projection exposure method.
Figures 2A, 2B:
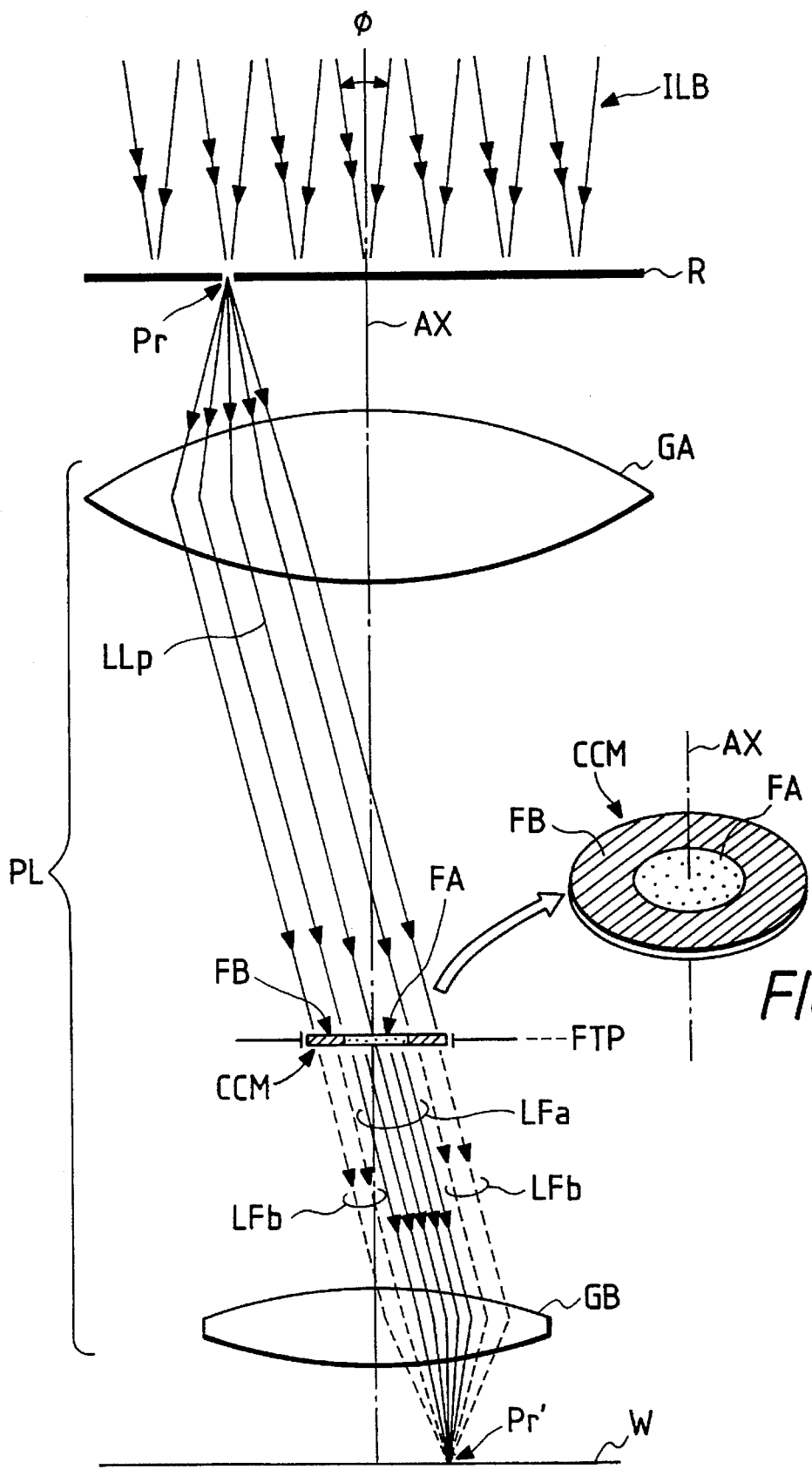
FIGS. 2A and 2B show an optical path in a projection optical system to illustrate the principle of a projection exposure apparatus according to the present invention.

The pattern surface of the reticle R and the emergence side surface (plane light source) of the fly-eye lens 7 are optically in Fourier transform relation by the composite system of the condensing lens 10, the lens system 12 and the condenser lens 14. Also, the incidence angle range $\phi$ (see FIG. 2A) of the illuminating light entering the reticle R varies in conformity with the opening diameter of the aperture stop 8. For example, when the opening diameter of the aperture stop 8 is made small and the substantial area of the plane light source is made small, the incidence angle range $\phi$ also becomes correspondingly small. That is, the aperture stop 8 adjusts the spatial coherency of the illuminating light. As a factor representative of the degree of the spatial coherency, use is made of the ratio ($\phi$ value) of the sine of the maximum incidence angle $\phi/2$ of the illuminating light ILB to the numerical aperture NAr of the reticle side of the projection optical system PL. This $\phi$ value is usually defined by $\phi=\sin(\phi/2)/NAr$, and many of existing steppers are used within the range of the order of $\phi=0.5$–$0.7$.

Now, a predetermined reticle pattern is formed by a chromium layer on the pattern surface of the reticle R, and it is to be understood here that the chromium layer is deposited by evaporation on the whole surface and a plurality of contact hole patterns formed by a minute rectangular opening portion (a transparent portion free of the chromium layer) are present therein. The contact hole patterns are sometimes designed such that when projected onto a wafer W, they are of dimensions equal to or less than 0.5 µm square (or diameter), and the dimensions thereof on the reticle R are determined with the projecting magnification 1/M of the projection optical system PL taken into account. Also, the dimensions between adjacent contact hole patterns are usually considerably large relative to the dimensions of the opening portion of a contact hole pattern and therefore, each contact hole pattern exists as an isolated minute pattern. That is, two adjacent contact hole patterns are often spaced apart from each other to such a degree that lights (diffracted and scattered lights) created therefrom do not strongly affect each other like a diffraction grating. However, as will be described later in detail, there are also reticles on which contact hole patterns are formed considerably close to each other.

In FIG. 4, the reticle R is held by a reticle stage RST, and the optical images (light intensity distribution) of the contact hole patterns on the reticle R are formed on the photoresist layer on the surface of the wafer W through the projection optical system PL. The optical path from the reticle R to the wafer W in FIG. 4 is shown by only the principal ray of the beam of imaging light. The coherence reducing member CCM previously described with reference to FIGS. 2A to 3B and a double focalizing member DFM are provided on the Fourier transform plane FTP in the projection optical system PL. The coherence reducing member CCM and the double focalizing member DFM each have a diameter covering the maximum diameter of a pupil ep, and can be moved into and out of the optical path by a slider mechanism 20. If the stepper is used solely to expose contact hole patterns, the coherence reducing member CCM and the double focalizing member DFM may be fixed within the projection optical system PL.

However, where the exposing operation of the lithography process is performed by a plurality of steppers, when the most efficient use of each stepper is considered, it is hesitated to allot a particular stepper to the exposure exclusively for contact hole patterns. Therefore, it is desirable to provide the coherence reducing member CCM and the double focalizing member DFM insertably relative to the pupil ep of the projection optical system PL so that the stepper can also be used during the exposure of other reticle patterns than contact hole patterns. Depending on the projection optical system, a variable aperture stop (NA stop) for changing the actually effective diameter of the pupil may be provided at the pupil position (Fourier transform plane FTP) of the projection optical system. In such case, the aperture stop, the coherence reducing member CCM and the double focalizing member DFM are disposed as close as possible to one another so that they may not mechanically interfere with one another.

Now, the wafer W is held on a wafer stage WST which is two-dimensionally moved in a plane perpendicular to the optical axis AX (hereinafter referred to as "XY movement") and is finely moved in a direction parallel to the optical axis AX (hereinafter referred to as "Z movement"). The XY movement and Z movement of the wafer stage WST are effected by a drive unit 22, and the XY movement is controlled in accordance with the output value of a laser interferometer 23 and the Z movement is controlled on the basis of the detection value of an auto focus sensor 24. The drive unit 22, the slider mechanism 20, etc. are operated by a command from a main control unit 25. The main control unit 25 sends a command to a drive unit 26 and controls the opening and closing of the shutter 3, and also sends a command to a control unit 27 and controls the sizes (and shapes) of the openings in the aperture stop 8 and reticle blind 11. Further, the main control unit 25 is designed to be capable of inputting the name of the reticle read by a bar code reader 28 provided in the conveyance path of the reticle to the reticle stage RST. Accordingly, the main control unit 25 can generally control the operations, etc. of the slider mechanism 20 and aperture drive unit 27 correspondingly to the inputted name of the reticle and in conformity with exposure conditions stored in a memory, and can automatically adjust the dimensions of the openings in the aperture stop 8 and reticle blind 11 and the necessity or unnecessity of the coherence reducing member CCM and double focalizing member DFM in accordance with the reticle.

Figure 5:
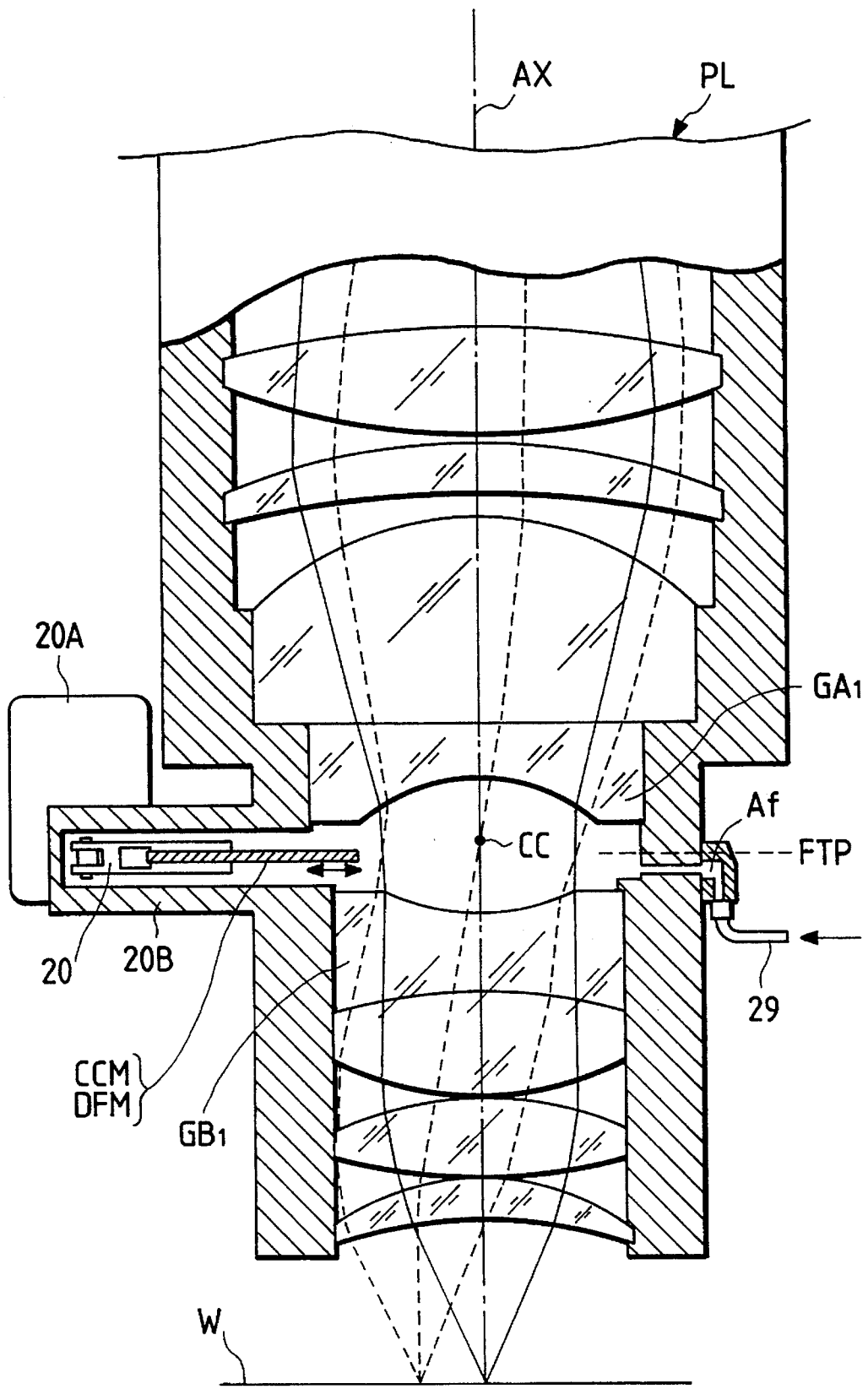
FIG. 5 is a cross-sectional view showing the detailed construction of portions of a projection optical system in FIG. 4.

The structure of portions of the projection optical system PL in FIG. 4 will now be described with reference to FIG. 5. FIG. 5 shows a partial cross-section of the projection optical system PL entirely made of a refractive glass material, and the Fourier transform plane FTP exists in the space between the lowermost lens GA1 of the front group lens system GA and the uppermost lens GB1 of the rear group lens system GB. The projection optical system PL has its plurality of lenses held by a lens barrel, and an opening portion is formed in a portion of the lens barrel to permit the insertion and removal of the coherence reducing member CCM and the double focalizing member DFM. Also, a cover 20B for preventing the whole or a part of the coherence reducing member CCM, the double focalizing member DFM and the slider mechanism 20 so as not to be directly exposed to the atmosphere is provided externally from the opening portion of the lens barrel. This cover 20B prevents minute dust particles floating in the atmosphere from entering into the pupil space of the projection optical system PL. An actuator 20A such as a rotational motor, a pen cylinder or a solenoid is coupled to the slider mechanism 20. Further, a flow path Af communicating with the pupil plane is provided in a portion of the lens barrel, and temperature-controlled clean air is supplied to the pupil space through a pipe 29 to thereby suppress the temperature rise of the coherence reducing member CCM and double focalizing member DFM by the absorption of part of the exposure light and the temperature rise of the entire pupil space. If design is made such that the clean air forcibly supplied to the pupil space is forcibly discharged through the slider mechanism 20 and actuator 20A, dust created by the slider mechanism 20, etc. could be prevented from entering into the pupil space.

FIGS. 6A to 6C show the structure of the coherence reducing member according to a first embodiment. In the present embodiment, the coherence reducing member is designed to control the polarized state of imaging light for the purpose of coherency reduction. The coherence reducing member thus utilizing the polarizing action will hereinafter be called the polarized state control member PCM. FIG. 6A is a cross-sectional view of the polarized state control member PCM, and FIG. 6B is a plan view thereof. As already described with reference to FIGS. 3A and 3B, the radius $r_1$ of the circular transmitting portion FA is set to $2r_1^2 = r_2^2$ relative to the actually effective maximum radius $r_2$ of the pupil ep, but actually need not satisfy this relation strictly. As is apparent from this expression, the area $\pi r_1^2$ of the circular transmitting portion 2 FA is about a half of the actually effective area $\pi r_2^2$ of the pupil.

Figure 3A:
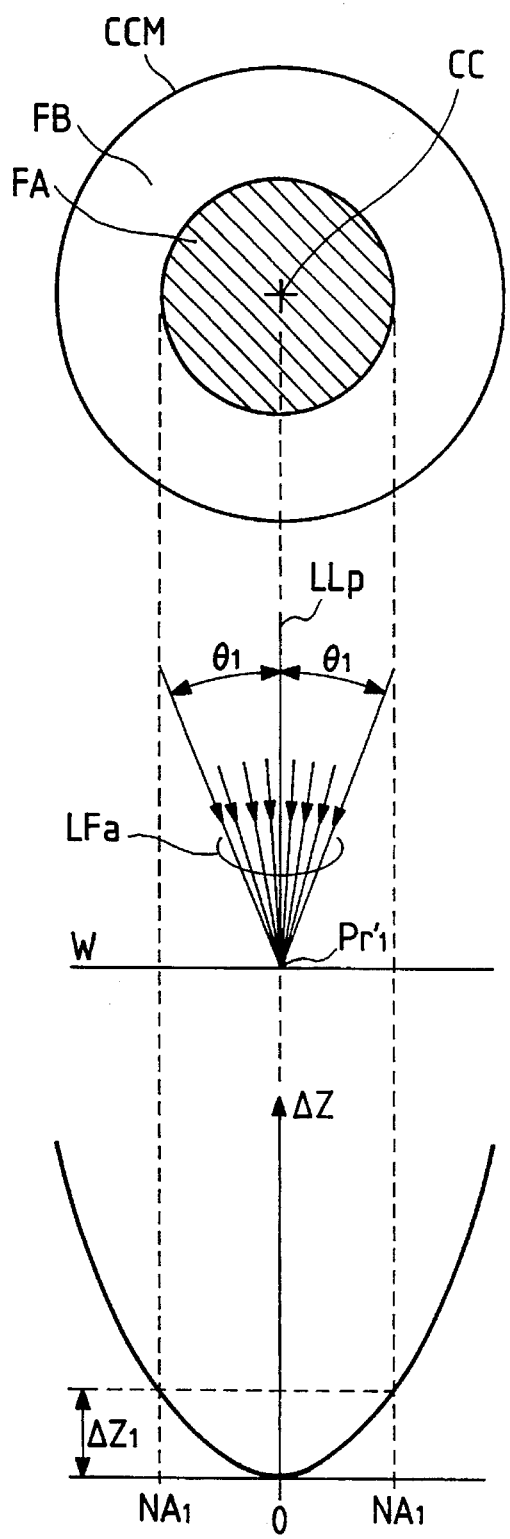
FIGS. 3A and 3B illustrate the principle of the coherence reducing member of the present invention.
Figure 3B:
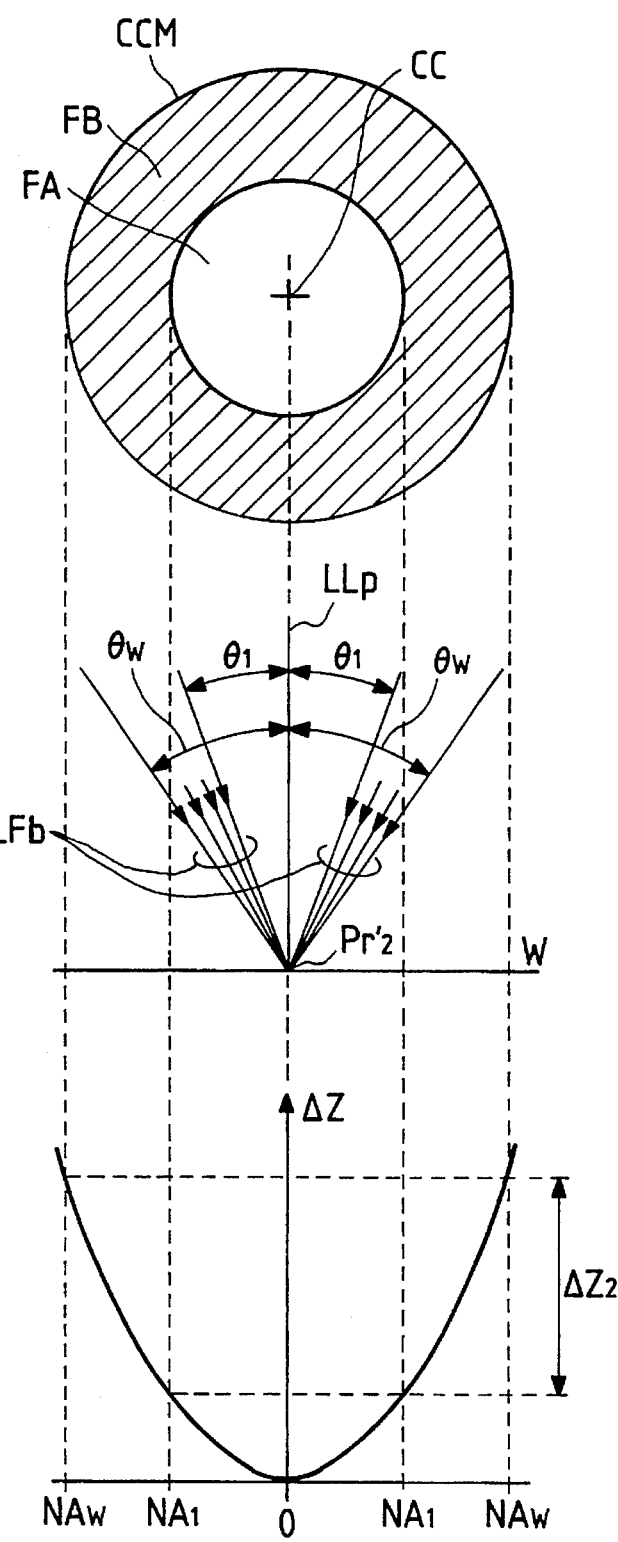

Now, the light source (mercury lamp 1) in FIG. 4 creates light of random polarized state (light which comprises lights of various polarized states combined together and of which the polarized state varies with time). In the first embodiment of the present invention, a linearly polarizing plate is used as the polarized state control member PCM of FIG. 6A and therefore, the polarization control member 6 in FIG. 4 is omitted. In that case, the polarized state of the beam of light transmitted through the contact hole pattern on the reticle and arriving at the polarized state control member PCM is also random. As regards the polarized state control member PCM shown in FIG. 6A, a circular transmitting portion FA of radius $r_1$ from the center point CC is constituted by a polarizing plate transmitting therethrough only linearly polarized light in a particular direction, and a zonal marginal transmitting portion FB coaxial with the center point CC is constituted by a polarizing plate transmitting therethrough only linearly polarized light in a direction orthogonal to the circular transmitting portion FA. Accordingly, the polarized state of the beam of imaging light transmitted through the polarized state control member PCM of FIG. 6A, as shown in FIG. 6C, becomes, for example, the vibration plane (polarization plane) of an electric field from right above to left below in FIG. 6C in the circular transmitting portion FA, and becomes a polarization plane from left above to right below in the marginal transmitting portion FB. That is, it becomes linearly polarized lights having directions of polarization orthogonal to each other in the circular transmitting portion FA and the marginal transmitting portion FB, i.e., beams of light (LFa, LFb) which do not interfere with each other. Description has already been made of the principle on which, as shown in FIGS. 3A and 3B, these two beams of light which do not interfere with each other arrive at the wafer W and the respective beams of light are independently amplitude-combined and form images (intensity distributions) $Pr'_1$ and $Pr'_2$ discretely, whereby the depth of focus of each image (intensity distribution) is increased.

Also, a quarter wavelength plate may be provided on the emergence side (wafer side) of the polarized state control member PCM shown in FIG. 6A, and first linearly polarized light transmitted through the circular transmitting portion FA and second linearly polarized light transmitted through the marginal transmitting portion FB which is orthogonal to the first linearly polarized light may be converted into circularly polarized lights of opposite directions. As described above, the circularly polarized lights of opposite directions do not interfere with each other and are suitable.

In the above-described first embodiment, the polarized state control member PCM is constituted by polarizing plates and thus, about a half of the original quantity of light to be transmitted through the projection optical system PL is absorbed by the polarized state control member PCM. This also means a reduction in the exposure power, but heat (the energy of the absorbed exposure light) is accumulated in the projection optical system, and this poses a problem in point of the stability of the glass material of the optical system.

Figure 7A:
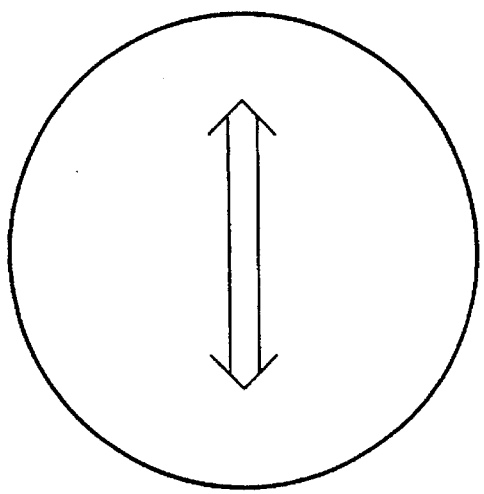
FIGS. 7A, 7B and 7C show another example of the construction of the coherence reducing member.

So, an embodiment for solving this problem of heat (the loss of the exposure power) will now be described as a second embodiment of the coherence reducing member with reference to FIGS. 7A to 7C. In this embodiment, the polarization characteristic of the illuminating light ILB becomes important. So, a polarizing plate is used as the polarization control member 6 in FIG. 4. If the light source is a laser or the like and the light therefrom is linearly polarized light from first, this polarizing plate will not have to be used. If the polarization characteristic of the illuminating light ILB to the reticle R is regularized by the use of such a polarization control member 6, the beam of imaging light transmitted through and diffracted by the contact hole pattern and arriving at the polarized state control member PCM in the projection optical system PL is also regularized into particular linearly polarized light.

Figure 7B:
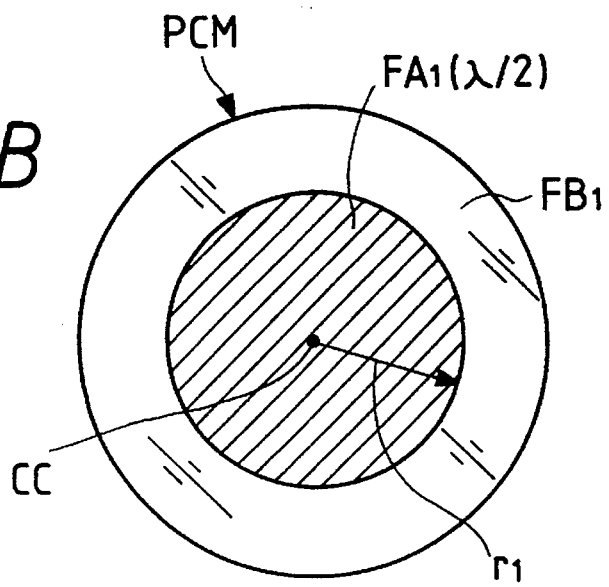
Figure 7C:
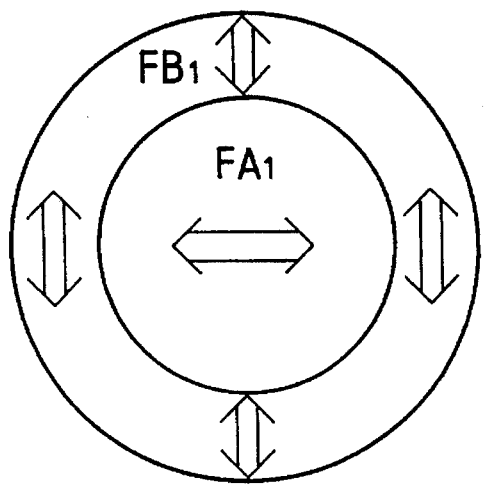

Now, when the illuminating light ILB is regularized into linearly polarized light, a half wavelength plate is used as the polarized state control member PCM, as shown in FIG. 7B. FIG. 7A shows the polarized state of the light immediately before it enters the polarized state control member PCM, and it is to be understood here that this light is linearly polarized light having the vibration plane of an electric field in the vertical direction in FIG. 7A. FIG. 7B shows the plane structure of the polarized state control member PCM. In FIG. 7B, the central circular transmitting portion $FA_1$ is constituted by a half wavelength plate of a radus $r_1$, and the marginal zonal transmitting portion $FB_1$ is a transparent plate (for example, quartz) having an optical thickness substantially equal to that of the transmitting portion $FA_1$ (half wavelength plate). The polarized state of the light passed through the polarized state control member PCM of FIG. 7B is converted into horizontal linearly polarized light only in the circular transmitting portion $FA_1$ as shown in FIG. 7C, and the polarized state varies in no way in the zonal transmitting portion $FB_1$. Therefore, as in the aforedescribed first embodiment, there can be obtained a polarized state in which the central portion and marginal portion of the beam of imaging light do not interfere with each other. Here, the axial direction (rotation in a plane) of the half wavelength plate (circular transmitting portion $FA_1$) is set to an axial direction for converting the direction of the incident linearly polarized light into a direction orthogonal thereto, but the polarized state control member PCM and the polarization control member 6 may be made rotatable relative to each other so as to optimize the axial direction of the half wavelength plate and the direction of polarization of the illuminating light ILB.

Also, use may be made of a polarized state control member in which both of the central circular transmitting portion $FA_1$ and the marginal zonal transmitting portion $FB_1$ are quarter wavelength plates and the axial directions of the two (directions which are high in refractive index in the flat plate) are made orthogonal to each other. In this case, the lights transmitted through the transmitting portions $FA_1$ and $FB_1$ become circularly polarized lights of opposite directions and neither interfere with each other. The axial directions of the two at this time and the direction of polarization of the linearly polarized light of the illuminating light are adjusted so as to deviate from each other by 45°.

Further, for the wavelength plates of the above-described two constructions, the illuminating light ILB may be used as circularly polarized light. In this case, when a half wavelength plate is utilized as the polarized state control member PCM, the lights transmitted through the central transmitting portion FA1 and the marginal transmitting portion FB1 become circularly polarized lights of opposite directions, and when a quarter wavelength plate is utilized as the polarized state control member PCM, said transmitted lights become linearly polarized lights orthogonal to each other. To make the illuminating light ILB into circularly polarized light, a quarter wavelength plate a Fresnel oblique member or the like can be provided more toward the reticle side than the aforedescribed polarization control member (polarizing plate) 6 in the illuminating system.

If thus, the incident beam of light (illuminating light ILB) is circularly polarized light, it will become unnecessary to rotatively adjust the axial direction of the half wavelength plate or the quarter wavelength plate in accordance with the polarization characteristic of the illuminating light, and this is convenient.

The use of the polarized state control member PCM as described above eliminates the problem of the absorption of the exposure energy as encountered in the aforedescribed first embodiment, and this is very convenient in that the accumulation of heat in the projection optical system PL is suppressed. This time, however, the loss of the quantity of light resulting from regularizing the illuminating light ILB into a polarized state in the illuminating optical system remains as a problem.

Figure 8A:
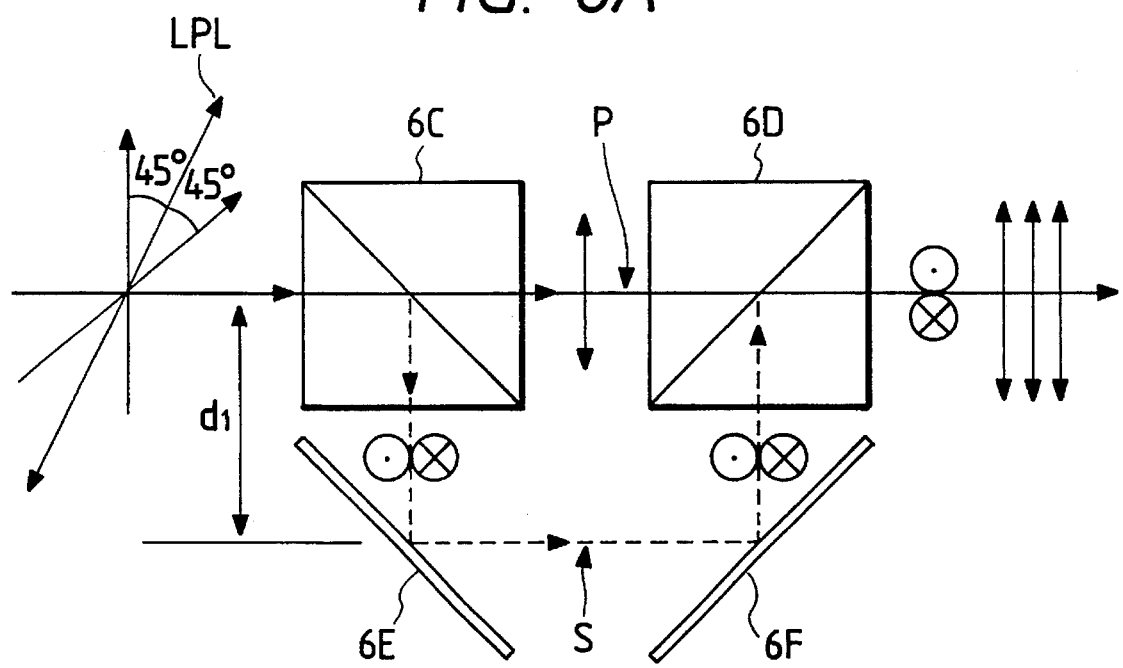
FIGS. 8A and 8B show the construction of portions of an illuminating optical system which the direction of polarization is controlled.
Figure 8B:
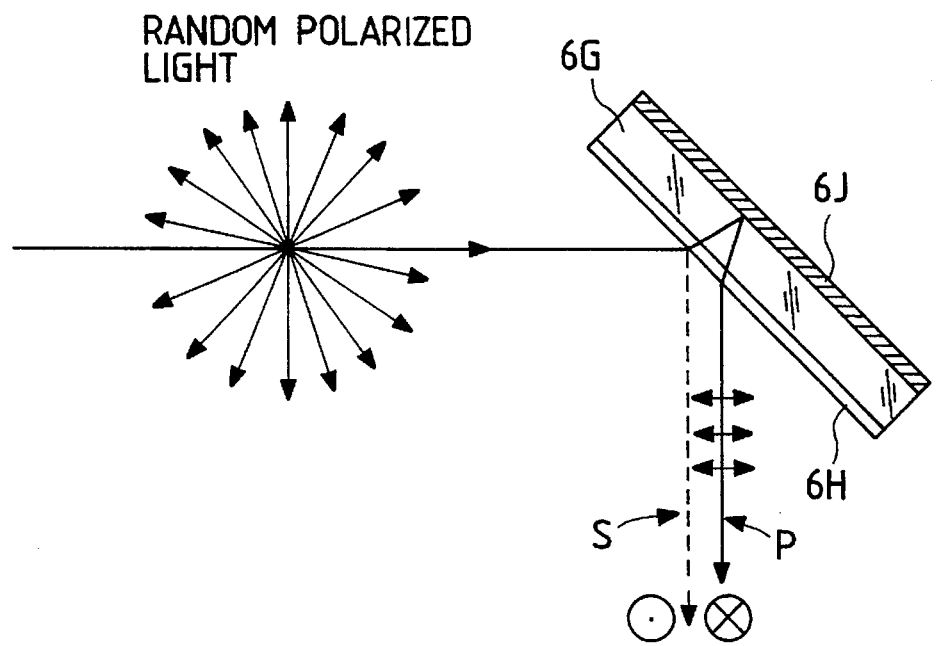

So, an example of the illuminating system in which the loss of the quantity of the illuminating light is reduced will now be described as a third embodiment with reference to FIGS. 8A and 8B. The system of FIGS. 8A and 8B is provided in place of the polarization control member 6 in FIG. 4. In FIG. 8A, the incident beam of light is divided by two polarizing beam splitters 6C and 6D and the divided beams are combined together by the same beam splitters. That is, p-polarized (polarized in the vertical direction in the plane of the drawing sheet of FIG. 8A) component is transmitted through the first polarizing beam splitter 6C and this p-polarized component is transmitted also through the second polarizing beam splitter 6D and travels rectilinearly. On the other hand, s-polarized (polarized in a direction perpendicular to the plane of the drawing sheet of FIG. 8A) component reflected by the first polarizing beam splitter 6C is combined with the p-polarized component by the second polarizing beam splitter 6D via mirrors 6E and 6F spaced apart by a distance $d_1$ from each other, and travels coaxially with the p-polarized component. At this time, an optical path difference $2 \times d_1$ is given to the p-polarized component and the s-polarized component by the optical paths of the mirrors 6E and 6F.

Accordingly, if the time coherent length $\Delta Lc$ of the incident beam of light is shorter than $2d_1$, the p-polarized component and s-polarized component after combined together are complementary to each other in the direction of polarization and become incoherent in terms of time. When use is made of the illuminating light having these two polarized components and the polarized state control member PCM of FIG. 7B, each of the p-polarized component and s-polarized component (FIG. 9A) entering the polarized state control member PCM becomes four beams of light which do not interfere with one another after transmitted through the polarized state control member PCM, as shown in FIG. 9C. That is, in the circular transmitting portion $FA_1$ (half wavelength plate), the direction of polarization is rotated by 90°. These four beams of light differ in the direction of polarization from one another and are incoherent in terms of time even if their directions of polarization are the same in the transmitting portions $FA_1$ and $FB_1$ and therefore, they do not interfere with one another. That is, the s-polarized component passed through the transmitting portion $FA_1$ is converted into p-polarized component and becomes the same in the direction of polarization as the p-polarized component transmitted through the transmitting portion $FB_1$, but those two lights are incoherent in terms of light and therefore do not interfere with each other.

Figure 9A:
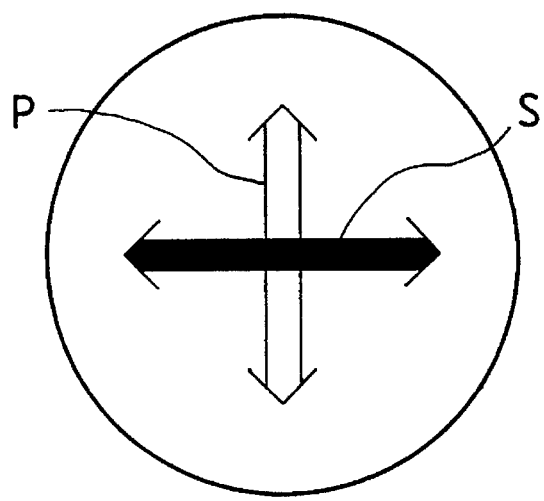
FIGS. 9A, 9B and 9C illustrate the state when the coherence reducing member of FIG. 7B and the illuminating optical system of FIG. 8A or 8B are combined together.

If use is not made of the illuminating light from the polarization control member constructed as shown in FIG. 8A, the p-polarized light and s-polarized light of FIG. 9A will remain coherent in terms of time and therefore, the beams of light after transmitted through the polarized state control member PCM will also interfere with each other if they are the same in the direction of polarization, and the effect of the present invention will lessen. The system shown in FIG. 8A enables the optical path length difference between the two polarized components which should be combined together to be great and therefore, it is suitable for a light source of relatively great time coherent length, for example, a narrow-band laser source or the like.

When a light source emitting linearly polarized light is employed as the laser source, the effect of the present invention could be obtained even if the polarization control means of the construction of FIG. 8A is not used. However, if the polarization control means of FIG. 8A is used for a laser source emitting linearly polarized light, the illuminating light could be made into two beams of light which are incoherent in terms of time, and this leads to the effect that speckles and interference fringes (illuminance irregularity) which will pose a problem during the use of the laser source can be reduced. In this case, the direction of polarization of the linearly polarized light entering the first polarizing beam splitter 6C of FIG. 8A may preferably be the intermediate direction of polarization LPL between the direction of p-polarization and the direction of s-polarization (the direction of 45° from the two), relative to the first polarizing beam splitter 6C, as shown in FIG. 8A.

Now, when the light source has a relatively great spectrum width like a mercury lamp, the time coherent length thereof is short and therefore, a simple member as shown in FIG. 8B can be used as the polarization control member 6 in FIG. 4. This member is a plane parallel plate 6G of quartz or the like having polarizing reflecting film 6H attached to the surface thereof and having total reflection film 6J of a metal or the like attached to the back thereof, and is disposed so as to reflect a collimated beam of light from the light source at a predetermined angle. Of the random polarized incident light from the mercury lamp, the s-polarized component is reflected by the film 6H on the surface and the p-polarized component is transmitted through the film 6H on the surface and the plane parallel plate 6G and is reflected by the film 6J on the back, and an optical path difference corresponding nearly the double of the thickness (optical thickness) of the plane parallel plate 6G is given to the s-polarized component and p-polarized component.

For example, in the case of i-ray from the mercury lamp, the center wavelength $\lambda$ is 365 nm and the wavelength width $\Delta\lambda$ is of the order of 5 nm and therefore, from the expression $\Delta Lc = \lambda^2/\Delta\lambda$ of a general coherent length, the coherent length $\Delta Lc$ is of the order of 26 μm. Accordingly, even if the plane parallel plate 6G is sufficiently thin (e.g. of the order of 1 mm), there can be given an optical path length difference sufficient to cancel time coherence.

Of course, even if the illuminating light ILB is made into two time incoherent beams of circularly polarized light of opposite directions instead of two time incoherent beams of linearly polarized light orthogonal to each other, a good effect will be obtained as in the aforedescribed embodiment and there will be no loss of the quantity of light. To make the illuminating light ILB or the beam of light before arriving at the polarized state control member PCM into circularly polarized light, a quarter wavelength plate or the like can also be provided in the optical path from the system shown in FIGS. 8A and 8B to the polarized state control member PCM.

While in the foregoing, there has been shown an embodiment in which a polarizing plate utilizing the polarization characteristic, or a quarter wavelength plate or a half wavelength plate is used as the coherence reducing member provided on the pupil plane of the projection optical system, a member utilizing time coherency may also be used as the coherence reducing member. That is, use may also be made of a member for giving between the imaging lights passing through the central portion and marginal portion of the pupil plane an optical path difference equal to or greater than the coherent length of those lights.

For example, when use is made of a construction similar to the polarized state control member PCM shown in FIGS. 6A and 6B and the central transmitting portion FA and marginal transmitting portion FB thereof are made of glasses (such as quartz) differing more or less in thickness, the time coherency between the beam of light transmitted through the central transmitting portion FA and the beam of light transmitted through the marginal transmitting portion FB can be made to almost vanish. For example, as described above, the coherent length $\Delta Lc$ of i-ray is about 26 μm and therefore, when the refractive index n of the glass used is 1.5 and the difference between the thicknesses of the two (FA and FB) is t, the relation therebetween can be $(n-1)t \geq 26$ μm and there can be the difference of $t \geq 52$ μm in thickness. Also, by making the thicknesses of the two transmitting portions (FA and FB) equal to each other and making the refractive indices of the two portions different from each other (using different materials), it is possible to give an optical path length difference equal to or greater than the coherent length. Also, by reducing the coherency of the beam of light in the pupil plane by the polarizing action or reducing the coherency by the optical path length difference, as previously described, the effect of the present invention can likewise be obtained.

Each embodiment of the coherence reducing member provided on the pupil plane of the projection optical system has been described above, and description will not be made of the double focalizing member which is another member provided on the pupil plane of the projection optical system.

Figure 10A:
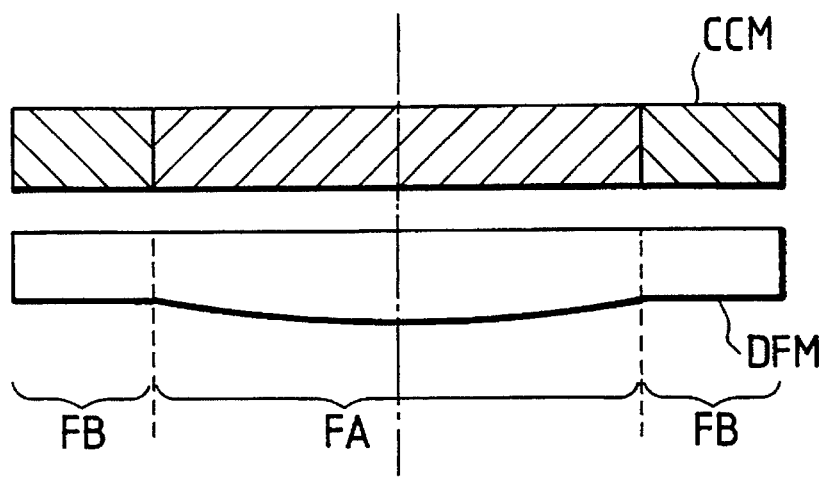
FIGS. 10A, 10B and 10C show the construction of double focalizing members according to the present invention.
Figure 10B:
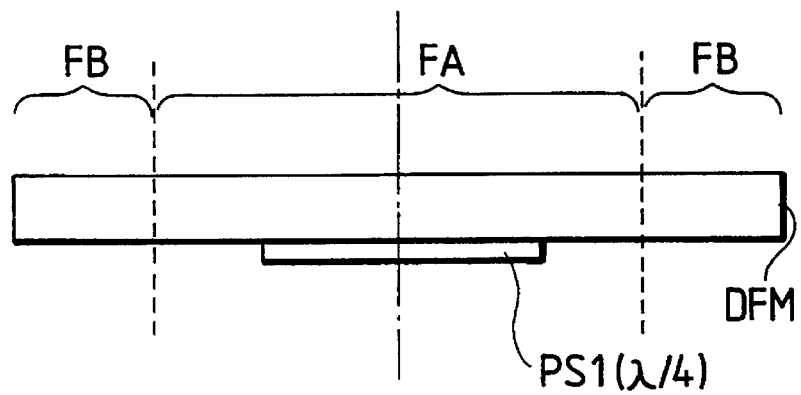
Figure 10C:
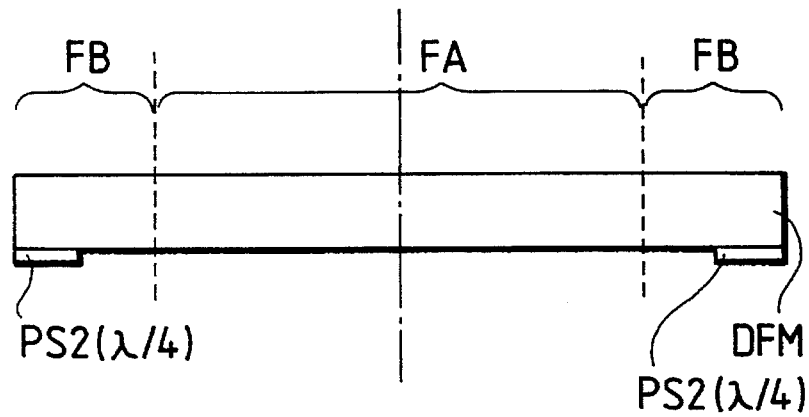

FIGS. 10A to 10C show various embodiments of the double focalizing member DFM in FIG. 4. The double focalizing member DFM in FIG. 10A is disposed on the pupil plane FTP of the projection optical system and adjacent to the aforedescribed coherence reducing member CCM. Correspondingly to the circular transmitting portion FA and zonal transmitting portion FB of the coherence reducing member CCM, the double focalizing member DFM is divided into a circular central transmitting portion FA and a zonal marginal transmitting portion FB. Accordingly, the beam of light transmitted through the circular transmitting portion FA of the coherence reducing member CCM is transmitted through the central transmitting portion FA of the double focalizing member DFM, and the beam of light transmitted through the zonal transmitting portion FB of the coherence reducing member CCM is transmitted through the marginal transmitting portion FB of the double focalizing member DFM. In the embodiment of FIG. 10A, the double focalizing member DFM is a plane parallel plate in the marginal transmitting portion FB, while it is a plano-convex lens of small refractive power in the central transmitting portion FA. That is, the double focalizing member DFM as an imaging member is such that the focal length thereof is infinity (refractive power is 0) in the marginal transmitting portion FB and the focal length thereof is a positive finite value (refractive power also is a positive finite value) in the central transmitting portion FA.

Thus, of all beams of light emerging from a point on the reticle and passing to a point on the wafer, the beam of light transmitted through the central transmitting portion FA of the double focalizing member DFM is subjected to a stronger refracting action than the beam of light transmitted through the marginal transmitting portion FB. Thus, the beam of light transmitted through the central transmitting portion FA forms its focus at a position nearer to the projection optical system PL than the focus position by the beam of light transmitted through the marginal transmitting portion FB. As a result, the image by the beam of light transmitted through the central transmitting portion FA and the image by the beam of light transmitted through the marginal transmitting portion FB are formed near the wafer and at positions spaced apart from each other in the direction of the optical axis, and an improvement in the depth of focus similar to that in the prior-art FLEX method is obtained. Of course, both of the image by the beam of light transmitted through the central transmitting portion FA and the image by the beam of light transmitted through the marginal transmitting portion FB have a depth of focus greater than in the prior art due to the use of the coherence reducing member CCM and therefore, the enlargement of the depth of focus by the double focalizing member DFM becomes much greater than by the prior-art FLEX method.

FIG. 10B shows a first modification of the double focalizing member DFM. In FIG. 10B, a phase shifter PS1 is provided in the circular partial area of the central transmitting portion FA which is near the optical axis. This phase shifter PS1 gives a phase difference of $\lambda/4$ to between the illuminating light (wavelength $\lambda$) passing through the phase shifter PS1 and the illuminating light passing through the other area than that. FIG. 10C shows a second modification of the double focalizing member DFM. In this modification, a phase shifter PS2 for giving a phase difference of $\lambda/4$ is provided in the outer zonal partial area of the marginal transmitting portion FB. Although not shown, in FIGS. 10B and 10C as well, a coherence reducing member CCM is disposed on the upper surface or the lower surface of the double focalizing member DFM. When a phase difference of $\lambda/4$ is partially given to the interior of the central transmitting portion FA or the marginal transmitting portion FB as described above, the focus positions by the lights transmitted through these areas can be made to differ in the direction of the optical axis, as compared with a case where the phase difference is not given.

Figure 11A:
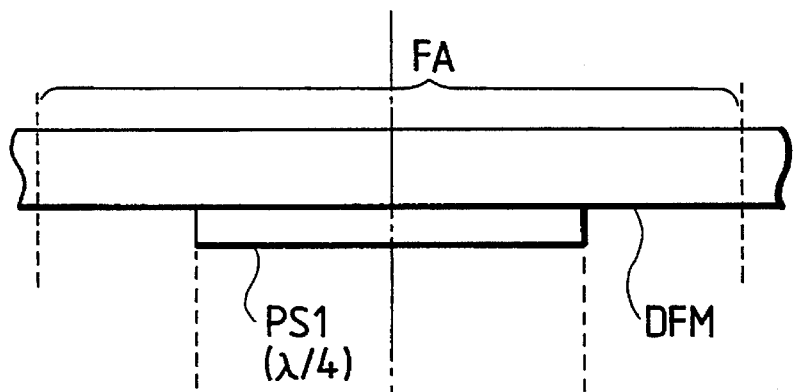
FIGS. 11A and 11B show the construction of a double focalizing member formed by a phase shifter.
Figure 11B:
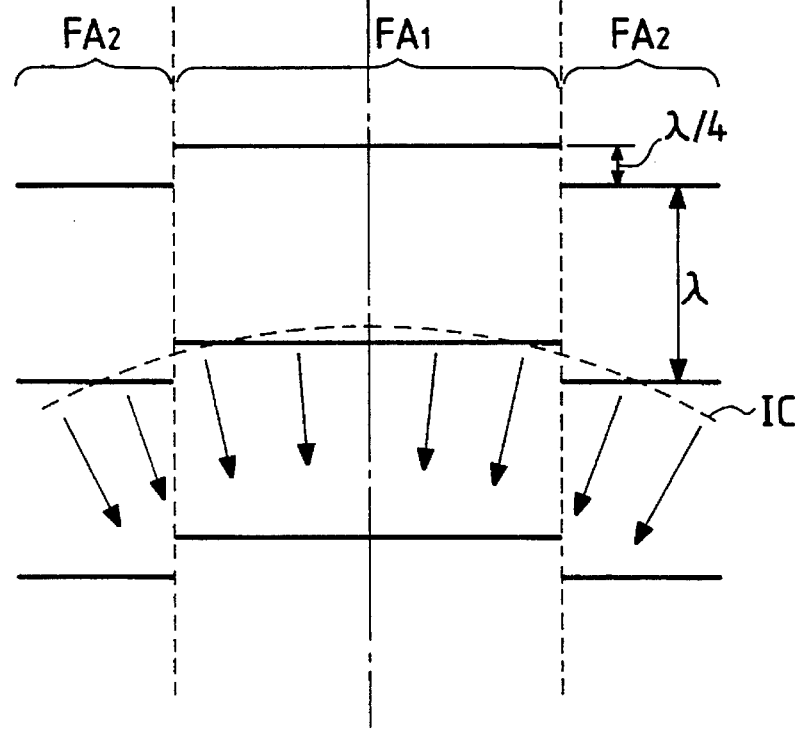

FIGS. 11A and 11B are views for illustrating a variation in the focus position by the phase shifter which gives a phase difference of $\lambda/4$. FIG. 11A shows a double focalizing member DFM similar to that shown in FIG. 10B. FIG. 11B shows the state of the wave front of the imaging light immediately after transmitted through the double focalizing member DFM. In FIG. 11B, in the central transmitting portion FA, the wave front of the illuminating light transmitted through a partial area FA' near the optical axis is delayed by $\lambda/4$ as compared with the wave front of the illuminating light transmitted through a partial area $FA_2$ outside the area $FA_1$. In FIG. 11B, the direction of travel of the illuminating light is downward. When at this time, these wave fronts are imaginarily linked together, the equal wave front IC becomes arcuate as indicated by broken line and the transmitted light arrives at the wafer while being subjected to a weak condensing action. This is entirely the same action as that of the convex lens shown in FIG. 10A. Accordingly, even if use is made of a phase shifter which gives a phase difference of $\lambda/4$ like the aforementioned convex lens, the beam of light transmitted through the central transmitting portion FA could be focused on the side nearer to the projection optical system PL than the in-focus position of the beam of light transmitted through the marginal transmitting portion FB.

On the other hand, in FIG. 10C, the beam of light transmitted through the marginal transmitting portion FB becomes a divergent beam of light to give a phase difference of $\lambda/4$ to the outermost partial area in the marginal transmitting portion B. That is, the double focalizing member DFM of FIG. 10C is equivalent to one having negative refractive power (a concave lens). Therefore, in FIG. 10C, the in-focus position of the beam of light transmitted through the marginal transmitting portion FB can be made farther from the projection optical system PL than the in-focus position of the beam of light transmitted through the central transmitting portion FA.

As described above, in FIGS. 10B and 10C, the beam of light transmitted through the central transmitting portion FA and the beam of light transmitted through the marginal transmitting portion FB have no mutual coherency and therefore, the aforedescribed equal wave front can be considered within only the central transmitting portion FA or the marginal transmitting portion FB. Also, in FIGS. 10B and 10C, a phase shifter for giving a phase difference of $\lambda/4$ is provided in one of the central transmitting portion FA and the marginal transmitting portion FB, but alternatively, phase shifters may be provided in both of the transmitting portions FA and FB. In such case, the focus position of the light transmitted through the central transmitting portion FA becomes more closer to the projection optical system than when the phase shifter is absent, and the focus position of the light transmitted through the marginal transmitting portion FB becomes farther from the projection optical system than when the phase shifter is absent. Thus, the focus position of the light transmitted through the central transmitting portion FA and the focus position of the light transmitted through the marginal transmitting portion FB become much farther from each other than when the phase shifter is provided in only one of the two transmitting portions. Further, in FIGS. 10B and 10C, the phase shifter for giving a phase difference of λ/4 is provided on the lower surface (the wafer side surface) of the double focalizing member DFM, but it may be provided on the upper surface (the coherence reducing member CCM side surface) of the double focalizing member DFM.

The phase shifters PS1 and PS2 for giving a phase difference of λ/4 which are employed in the present embodiment are used only for the purpose of giving suitable deformation to the wave front after transmitted and deforming the imaginary wave front into an arcuate shape. Accordingly, even if the amount of phase shift by the phase shifters PS1 and PS2 is not exactly λ/4(=π/2[rad]), there will be no particular problem, and the amount of phase shift can be within a range greater than zero and smaller than the order of λ/3(=2π/3[rad] ).

Also, in FIG. 4, the coherence reducing member CCM is provided on the upper side (the reticle side) of the double focalizing member DFM, but it may be provided on the lower side (the wafer side) of the double focalizing member DFM. Further, the coherence reducing member CCM and the double focalizing member DFM can be made integral with each other.

Figure 12A:
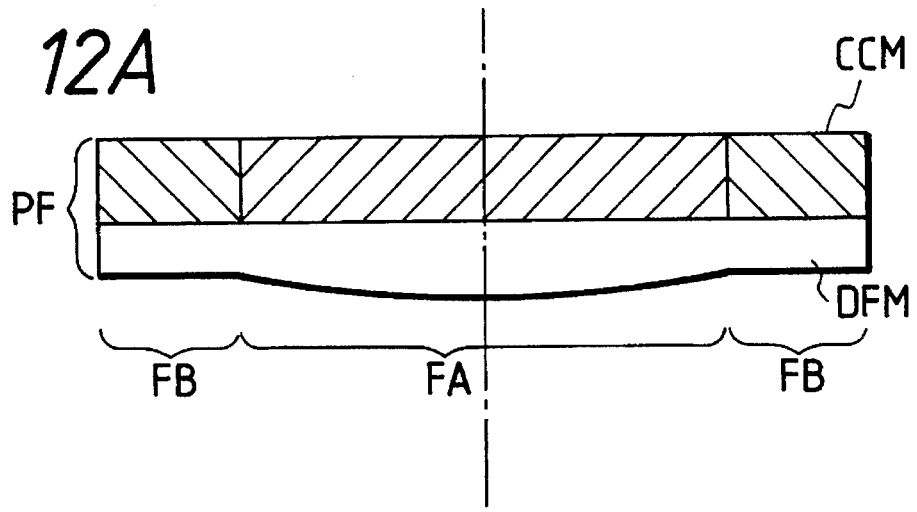
FIGS. 12A, 12B and 12C show the construction of a pupil filter in which the coherence reducing member and the double focalizing member are made integral with each other.
Figure 12B:
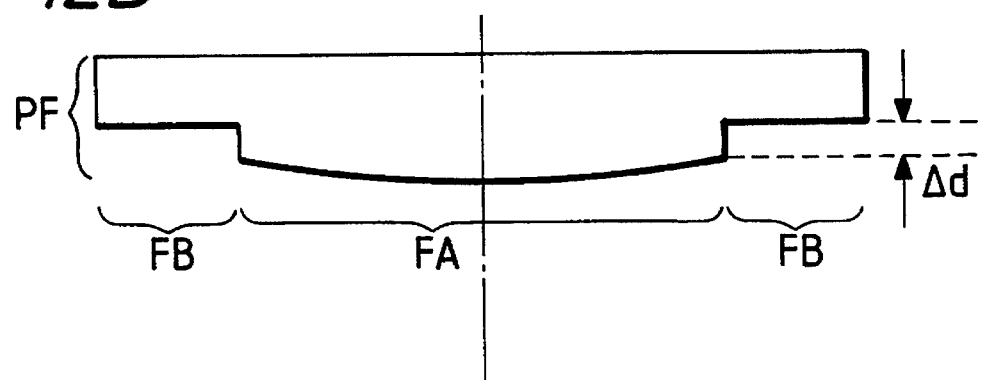
Figure 12C:
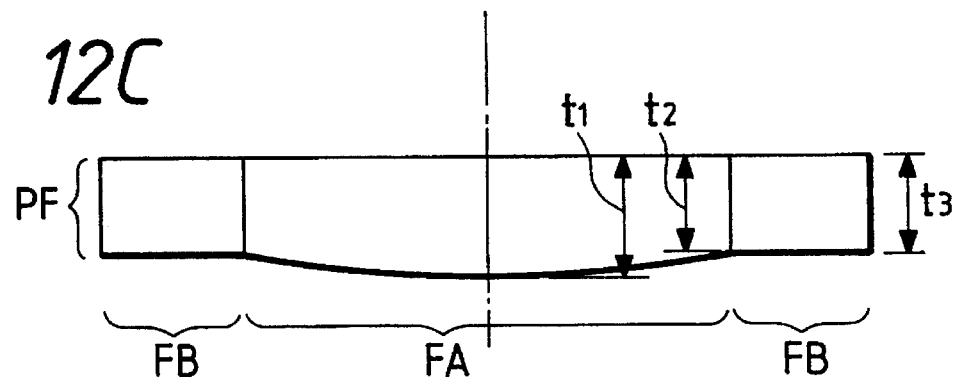

FIGS. 12A to 12C show examples of the construction of a member comprising the coherence reducing member CCM and the double focalizing member DFM made integral with each other (said member will hereinafter be simply referred to as the "pupil filter member PF"). FIG. 12A shows the construction of the pupil filter member PF in which the example of the construction shown in FIG. 10A is modified and the coherence reducing member CCM and the double focalizing member DFM are brought into close contact with each other. In FIG. 10A, the two are separately disposed and therefore, there are four surfaces through which the beam of light is transmitted. This gives rise to problems in respect of reflection (flare) and the working of each surface. In contrast, in FIG. 12A, the two are brought into close contact with each other and therefore, there are two surfaces which contact with air, and this is advantageous in respect of reflection and working.

FIG. 12B shows the construction of a pupil filter member suitable for a coherence reducing member of the type which reduces coherency by an optical path difference equal to or greater than the coherent length. In FIG. 12B, the pupil filter member PF comprises a glass plate in which the central transmitting portion FA is a plano-convex lens and the marginal transmitting portion FB is a plane parallel plate. In this case, the level difference Ad in the boundary between the central transmitting portion FA and the marginal transmitting portion FB is set so as to satisfy the following expression by the use of the refractive index n of the glass plate and the coherent length ΔLc of the illuminating light.

$(n-1)\Delta d \geq \Delta Lc$ (6)

FIG. 12C shows another example of the construction of the pupil filter member PF. In FIG. 12C, the central transmitting portion FA is a plano-convex lens having a refractive index $n_1$ and having a central thickness $t_1$ and a marginal thickness $t_2$, and the marginal transmitting portion FB is a plane parallel plate having a refractive index $n_2$ and having a thickness $t_3$.

In FIGS. 12B and 12C, the central transmitting portion FA may be made into a biconvex lens. Also, instead of the central transmitting portion FA being made into a convex lens, the marginal transmitting portion FB may be made into a concave lens. Further, the central transmitting portion FA may be made into a convex lens and the marginal transmitting portion FB may be made into a concave lens.

Also, the pupil filter member PF may be such that the central transmitting portion FA is a concave lens or the marginal transmitting portion FB is a convex lens. Such a construction in which the central portion is a concave lens or the marginal portion is a convex lens can be applied to any of the above-described embodiments. Also, for the embodiments using a phase shifter for giving a phase difference of λ/4 (FIGS. 10B and 10C), there is disposed a phase shifter for giving a phase difference of λ/4 to the marginal area in the central transmitting portion FA or the inner partial area in the marginal transmitting portion FB, whereby there can be obtained an effect equal to that of the construction in which the central portion is a convex lens and the marginal portion is a concave lens.

In such case, one of the following expressions (7) and (8) is satisfied, whereby the coherency between the beam of light transmitted through the central transmitting portion FA and the beam of light transmitted through the marginal transmitting portion FB can be reduced.

$n_1 t_2 - \{n_2 t_3 + (t_2 - t_3)\} = (n_1 - 1) t_2 - (n_2 - 1) t_3 \geq \Delta Lc$ (7)

$n_2 t_3 - \{n_1 t_1 + (t_3 - t_1)\} = (n_2 - 1) t_3 - (n_1 - 1) t_1 \geq \Delta Lc$ (8)

If at this time, the values of refractive indices $n_1$ and $n_2$ and the thicknesses $t_1$, $t_2$ and $t_3$ are set so as to satisfy the following expression, the influence imparted to the optical aberration of the projection optical system could be minimized.

$t_2(1-1/n_1) \geq t_3(1-1/n_2) \geq t_1(1-1/n_1)$ (9)

Modifications of the coherence reducing member CCM and double focalizing member DFM will now be described with reference to FIGS. 13A to 13C and FIGS. 14A to 14C.

Figure 13A:
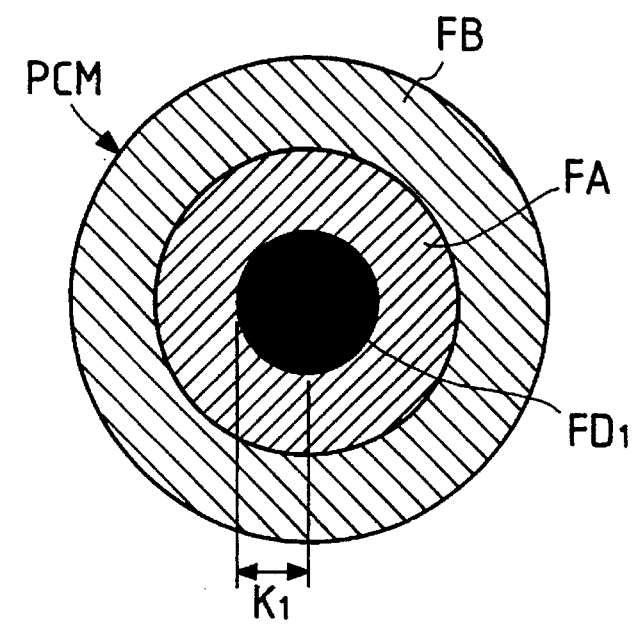
FIGS. 13A, 13B and 13C illustrate the construction and operation of a modification in which a circular light intercepting zone is provided centrally of the coherence reducing member.
Figure 13B:
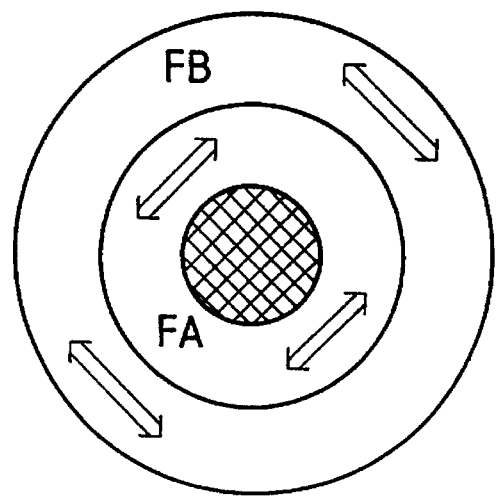
Figure 13C:
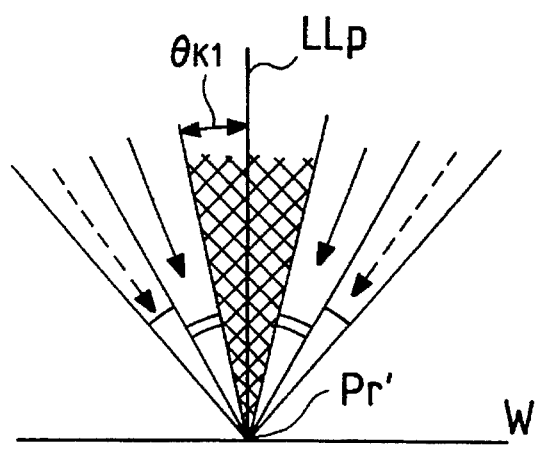

FIG. 13A shows a modification of the polarized state control member PCM as the coherence reducing member CCM, and a circular light intercepting portion $FD_l$ is provided in the central portion inside the zonal transmitting portions FA and FB. That is, in FIG. 13A, the central circular area in the circular transmitting portion FA in the polarized state control member PCM of FIG. 6B is made into a light intercepting portion. The imaging light transmitted through the polarized state control member PCM of FIG. 13A, as shown in FIG. 13B, is linearly polarized light having directions of polarization orthogonal to each other in the transmitting portions FA and FB. Now, when the radius of the light intercepting portion $FD_1$ is $K_1$, the incidence angle range of the beam of imaging light to the wafer W is restricted to two beams of light from $\sin\theta_{K1}$ to the numerical aperture NAw (the lights transmitted through the zonal transmitting portions FA and FB) as shown in FIG. 13C. When at this time, the zonal transmitting portions, including the light intercepting portion $FD_1$, are considered, the beam of imaging light present in the incidence angle range NAw is divided into three. Therefore, the angle range of a beam of light (the optical path length difference AZ by defocus) is also divided into three, that is, the optical path difference which adversely affects during defocus is decreased. Thus, further enlargement of the depth of focus can be achieved with respect to the imaging light transmitted through each of the transmitting portions FA and FB.

Figure 14A:
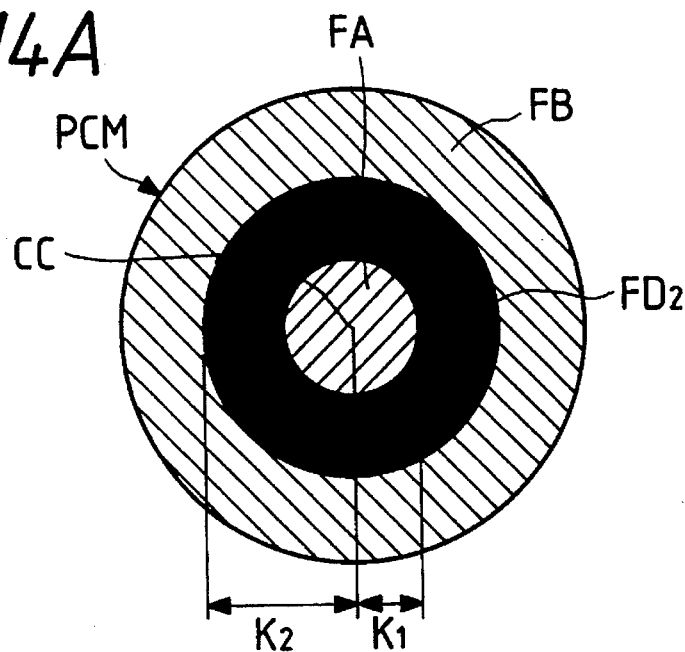
FIGS. 14A, 14B and 14C illustrate the construction and operation of a modification in which a zonal light intercepting zone is provided in the coherence reducing member.
Figure 14B:
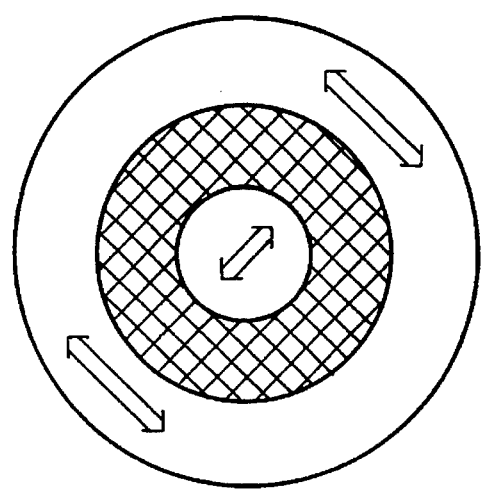
Figure 14C:
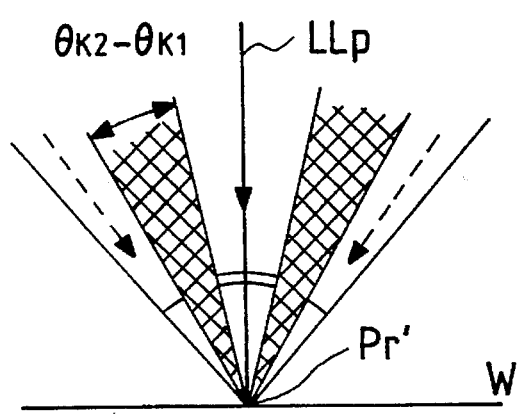

FIG. 14A shows a polarized state control member PCM in which the relation between the transmitting portion FA and the light intercepting portion $FD_1$ shown in FIG. 13A is reversed and a zonal light intercepting portion $FD_2$ is provided between the circular transmitting portion FA and the zonal transmitting portion FB. The imaging light transmitted through the polarized state control member PCM of FIG. 14A, as shown in FIG. 14B, is linearly polarized light having directions of polarization orthogonal to each other in the circular transmitting portion FA and the zonal transmitting portion FB. In FIG. 14A, the width of the light intercepting portion $FD_2$ is $(K_2-K_1)$, and as shown in FIG. 14C, part of the beam of imaging light is intercepted within an incidence angle range $(\theta_{K2}-\theta_{K1})$. Again in FIG. 14A, there is obtained an effect equal to that of FIG. 13A.

Figure 9B:
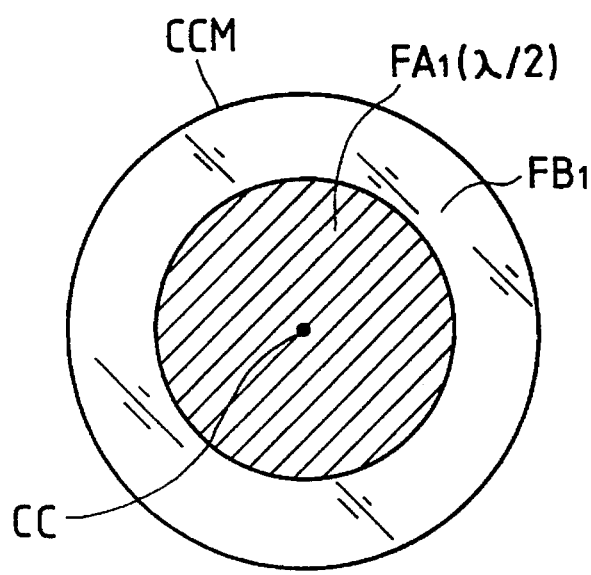
Figure 9C:
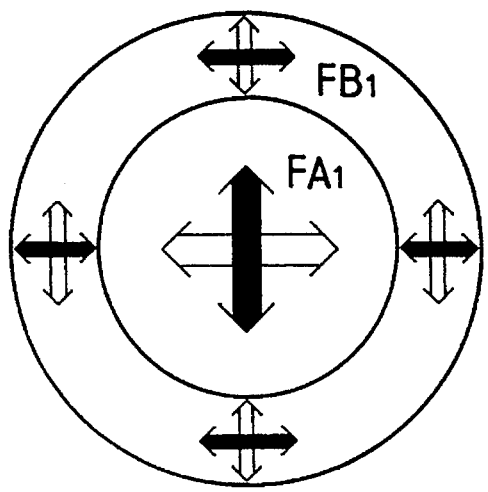

Now, in the polarized state control members PCM shown in FIGS. 13A and 14A, the circular transmitting portion or the zonal transmitting portion is made into a polarizing plate, but as shown in FIGS. 7B and 9B, use may be made of a quarter wavelength plate, a half wavelength plate or a polarimetric substance. Also, the light intercepting portions $FD_1$ and $FD_2$ in FIGS. 13A and 14A may be, for example, polarizing plates, or light intercepting film consisting of metal film deposited by evaporation on a wavelength plate, or metal plates provided discretely from the polarized state control member PCM. Also, the light intercepting portions $FD_1$ and $FD_2$ may be formed on the double focalizing member DFM. Further, in the pupil filter member PF wherein the coherence reducing member CCM and the double focalizing member DFM are made integral with each other as shown in FIGS. 12A to 12C, the light intercepting portions $FD_1$ and $FD_2$ may be formed on the upper surface or the lower surface thereof.

Also, the light intercepting portions $FD_1$ and $FD_2$ or a light intercepting plate equivalent thereto need only intercept light of an exposure wavelength and therefore, may be one using an optical sharp cut filter or the like formed by dielectric material thin film or the like to absorb a short wavelength range such as exposure light (ultraviolet light). When use is made, for example, of an alignment system of the TTL type in which an alignment mark on a wafer W is irradiated with He-Ne laser as a light source and the reflected light therefrom is detected through a projection optical system PL, there will not be the problem that the light intercepting portion $FD_1$, $FD_2$ or the light intercepting plate positioned on the pupil plane adversely affects (intercepts) the reflected light from the mark. Also, a portion of the light intercepting plate or the light intercepting portion $FD_1$, $FD_2$ through which a laser beam for illuminating the wafer mark or the reflected light from the mark passes may be made into a transmitting area, and if the area thereof is small, it will not particularly spoil the effect of the present invention.

Figure 15A:
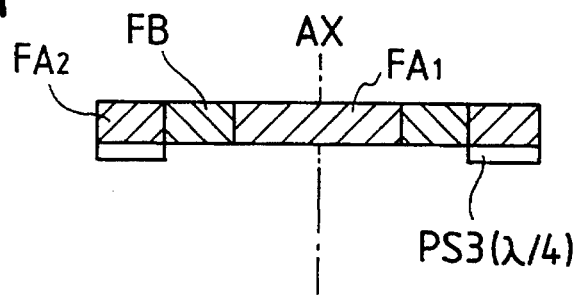
FIGS. 15A, 15B and 15C show another example of the construction of the pupil filter in which the coherence reducing member and the double focalizing member are made integral with each other.
Figure 15B:
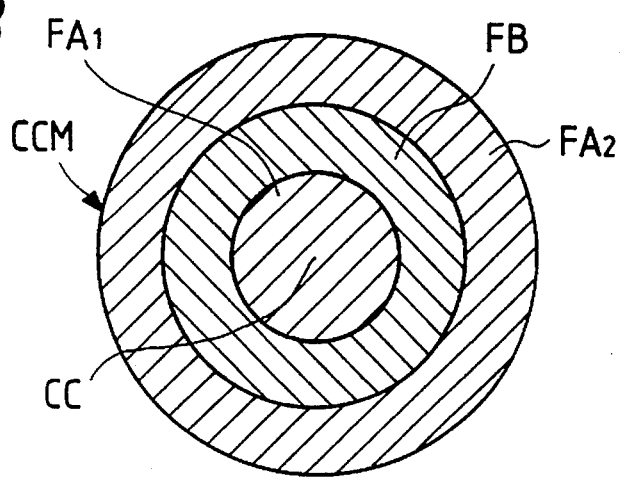
Figure 15C:
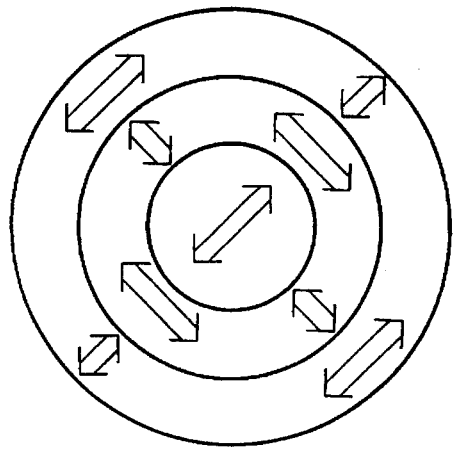

FIGS. 15A and 15B show another example of the construction of the pupil filter member in which the coherence reducing member and the double focalizing member are made integral with each other. In FIGS. 15A and 15B, the central circular transmitting portion $FA_1$ and the marginal zonal transmitting portion $FA_2$ are comprised of polarizing plates transmitting lights of the same directions of polarization therethrough, and the intermediate zonal transmitting portion FB is comprised of a polarizing plate transmitting therethrough light of a direction of polarization orthogonal to the direction of polarization of the transmitting portions $FA_1$ and $FA_2$. Accordingly, the beam of light transmitted through the central transmitting portion $FA_1$ and the beam of light transmitted through the marginal transmitting portion $FA_2$ become coherent. However, the beam of light transmitted through the marginal transmitting portion $FA_2$ is given a phase difference of $\lambda/4$ $(=\pi/2[rad])$ by a phase shifter PS3, with respect to the beam of light transmitted through the central transmitting portion $FA_1$. Accordingly, the imaginary wave fronts of the two beams of light become arcuate as in FIG. 10C, and the focus positions of the two beams of light deviate to the side farther from the projection optical system PL than the focus position when the phase shifter PS3 is absent (which focus position coincides with the focus position of the intermediate transmitting portion FB). In FIG. 15A, the coherence reducing member is comprised of a polarizing plate, but it may be a half wavelength plate or a quarter wavelength plate, or may be comprised of a member for giving an optical path difference equal to or greater than the coherent length.

Also, the drive unit 22 for the wafer stage WST shown in FIG. 4 may be made to have the function of the prior-art FLEX method in the control for finely moving the wafer W in the direction of the optical axis. By the use of FLEX method in combination, the depth of focus increasing effect of the present invention can be further increased. Also, the present invention can be applied to projection exposure apparatuses of any types, for example, a projection exposure apparatus of the stepper type using a projection lens, or a projection exposure apparatus of the step and scan type using a catadioptric optical system, or a projection exposure apparatus of the 1:1 mirror projection type. Particularly in the scan type (step and scan) or the mirror projection type, exposure is effected while the reticle and wafer are scanned and moved in a plane perpendicular to the optical axis of the projection optical system and therefore, the application of the prior-art FLEX method has been regarded as difficult, but the present invention has the advantage that it can be very simply applied to apparatuses of the scanning exposure type.

In some of apparatuses of the mirror projection type and the step and scan type, the pupil plane of the projection optical system sometimes coincides with or becomes near to the reflecting surface of a reflecting element. In such case, an optical element in which the radius of curvature of the reflecting surface is made different between the vicinity and margin of the optical axis can also be used as a double focalizing member. Also, by providing a level difference $Sd(Sd \geq (\frac{1}{2})\Delta Lc)$ between vicinity and margin of the optical axis of the reflecting surface, said reflecting surface can be used as a coherence reducing member utilizing an optical path length difference.

The effect of the above-described embodiment will now be described on the basis of the result of simulation.

Figure 16A:
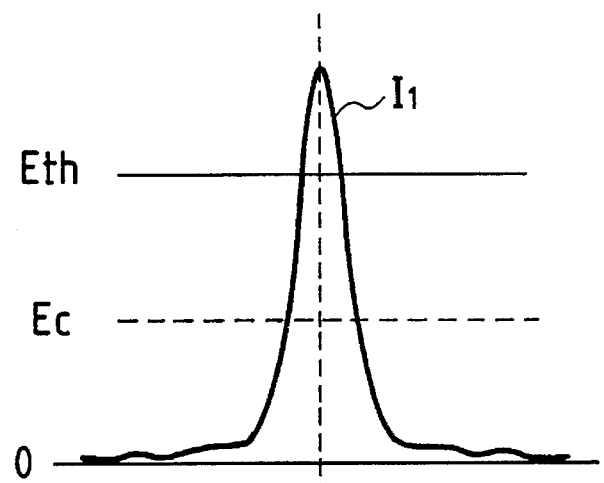
FIGS. 16A, 16B and 16C show the result of the simulation of the intensity distribution of an optical image obtained by projection-exposing a single contact hole pattern by SFINCS method using the pupil filter member of any of FIGS. 10A, 12A, 12B and 12C.
Figure 16B:
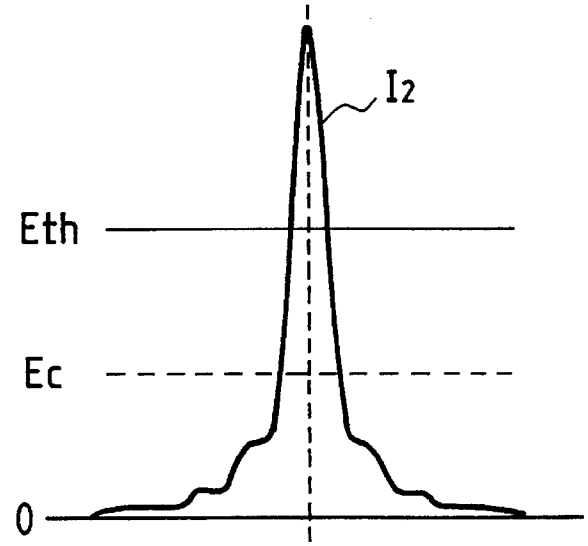
Figure 16C:
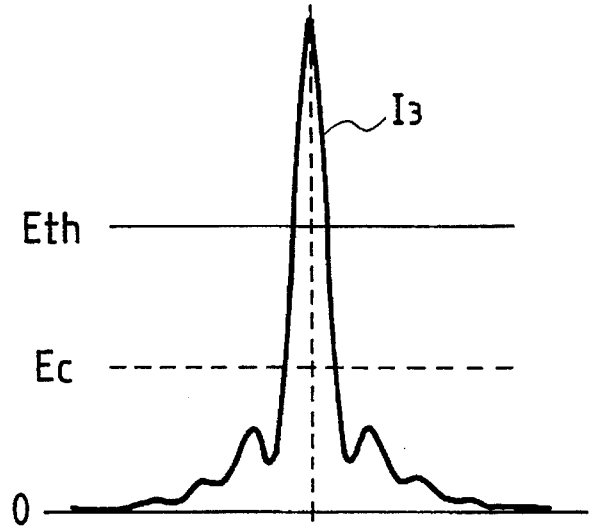

FIGS. 16A to 16C show the projected image (the intensity distribution of the optical image) of the contact hole pattern by the above-described embodiment. The actual form of the pupil filter member PF comprising the coherence reducing member CCM and the double focalizing member DFM disposed in the projection optical system PL is as shown in one of FIGS. 10A and 12A to 12C. The illuminating light is i-ray (wavelength 0,365 nm), the wafer side numerical aperture NA of the projection optical system is 0.57, and the contact hole pattern on the reticle is 0.30 μm square as converted on the wafer. Also, as regards, for example, the pupil filter member PF of FIG. 12A, the radius $r_1$ of the central transmitting portion FA is 0.65 time as great as the radius $r_2$ of the pupil (a value corresponding to the numerical aperture NA of the projection optical system), and the difference between the best focus position of the beam of light passing through the central transmitting portion FA and the best focus position of the beam of light passing through the marginal transmitting portion FB is 3 μm (=2.67×λ/NA$^2$)

FIG. 16B shows the optical axis $I_2$ of the contact hole pattern at the substantially best focus position of the combined image. This position is a position farther by 2 μm from the projection optical system than the best focus position of the beam of light transmitted through the central transmitting portion FA and nearer by 1 μm to the projection optical system than the best focus position of the beam of light transmitted through the marginal transmitting portion FB. In FIGS. 16A to 16C, the exposure amount Eth indicated by solid line represents an exposure amount necessary to sensitize positive type photoresist completely (to such a level that it is completely dissolved after developed), and the gain of the optical image $I_2$ is determined such that the width at said exposure amount Eth is 0.3 μm (design value).

FIGS. 16A and 16C show optical images $I_1$ and $I_3$ of the same gains as FIG. 16B but at +1 μm defocus position (the side toward the projection optical system) and −1 μm defocus position (the side away from the projection optical system), respectively. From FIGS. 16A to 16C, it is seen that in the present embodiment, there is no great difference between the optical image $I_2$ at the best focus position and the optical images at ±1 μm defocus positions, that is, the depth of focus is great.

Figure 18A:
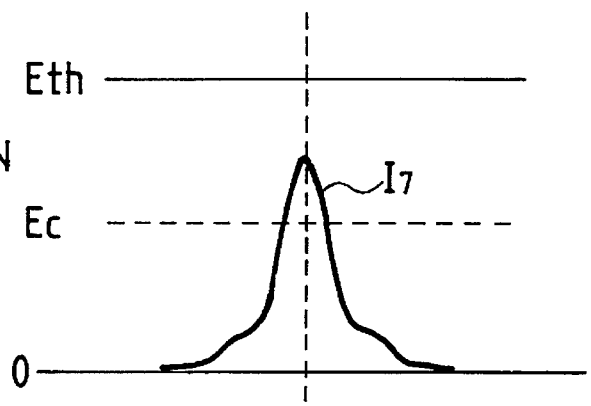
FIGS. 18A, 18B and 18C show the result of the simulation of the intensity distribution of an optical image obtained by projection-exposing a single contact hole pattern by the prior-art exposure method.
Figure 18B:
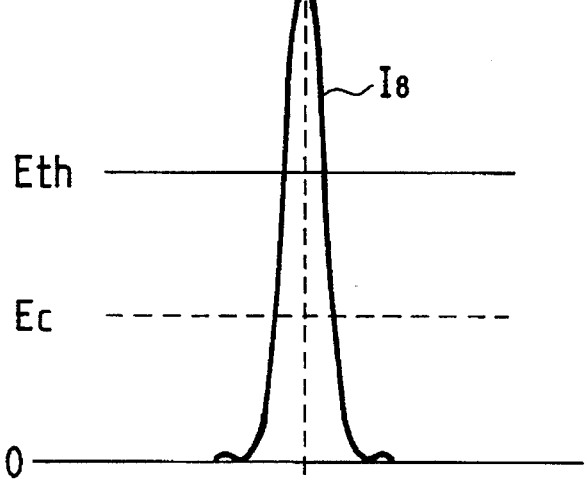
Figure 18C:
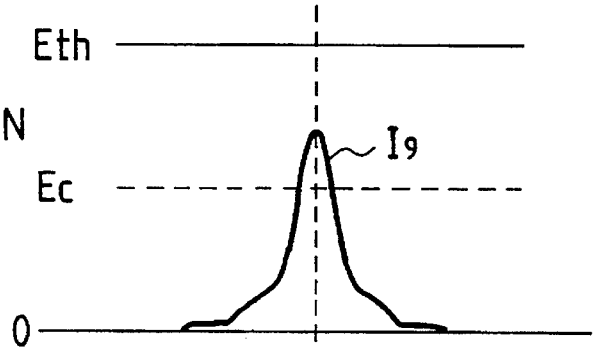

On the other hand, FIGS. 18A to 18C show optical images by the prior-art exposure method. In the present example, there is a great difference among the optical image $I_8$ (FIG. 18A) at the best focus position, the optical image $I_7$ (FIG. 18A) at +1 μm defocus position and the optical image $I_9$ (FIG. 18C) at −1 μm defocus position and therefore, it is seen that the deterioration of the image by defocus is great and the depth of focus is small. As regards also the result of simulation shown in FIGS. 18A to 18C, the other conditions than the pupil filter member, i.e., the numerical aperture of the projection optical system, the exposure wavelength λ, the coherence factor (φ value) of the illuminating optical system, the size of the contact hole pattern and the method of setting the gain of the optical image, are all the same as those in the case of FIGS. 16A to 16C, and this also holds true of the subsequent simulation.

FIGS. 19A to 19C show the result of the simulation of the optical image by the prior-art FLEX method, and it has been found that in the present embodiment (the result of simulation of FIGS. 16A to 16C, there is obtained the same degree of depth of focus as the result of simulation by the FLEX method of FIGS. 19A to 19C. The FLEX method here is of a type in which exposure of equal exposure amount is effected once at each of three discrete points spaced apart by 1.25 μm from one another in the direction of the optical axis.

Figure 17A:
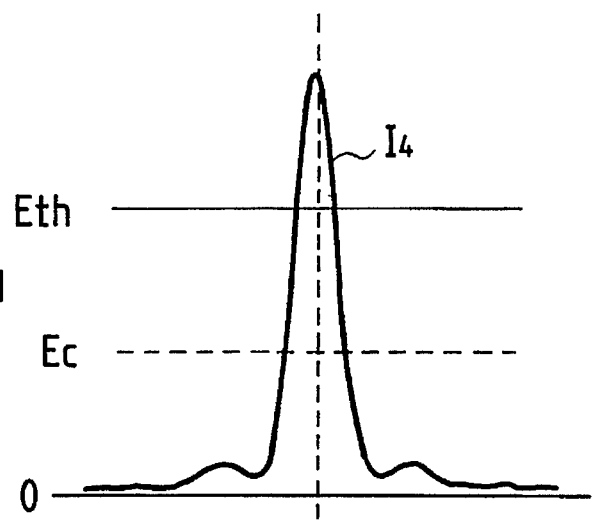
FIGS. 17A, 17B and 17C show the result of the simulation of the intensity distribution of an optical image by projection-exposing a single contact hole pattern by SFINCS method using the pupil filter member of FIG. 13A.
Figure 17B:
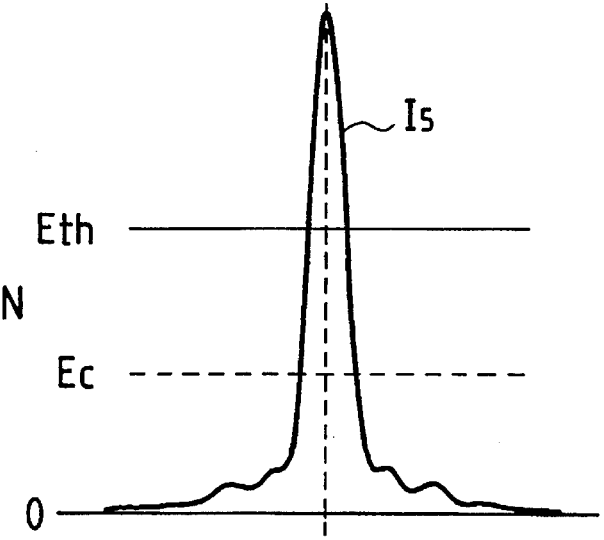
Figure 17C:
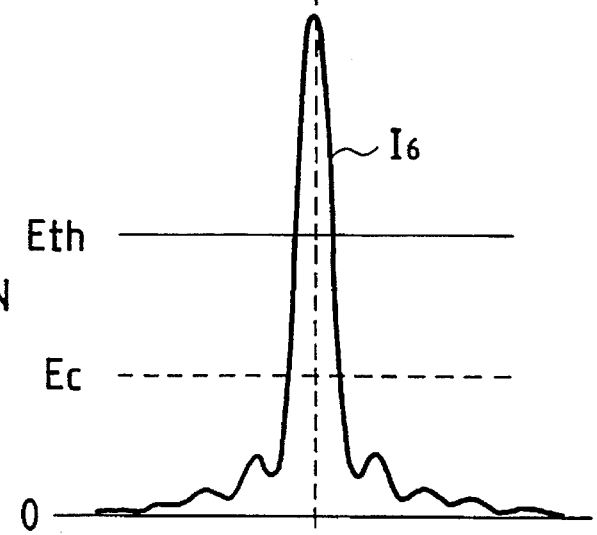

On the other hand, the result of simulation of FIGS. 17A to 17C show optical images $I_4$–$I_6$ formed when use is made of a pupil filter member discrete from that in the case of FIGS. 16A to 16C, and it is to be understood here that the pupil filter member of FIG. 13A is used. As regards the radius of each area of the pupil filter, the radius of the central light intercepting portion $FD_1$ is 0.3 time as great as the outer radius of the marginal transmitting portion FB (the radius of the pupil) and the outer radius of the intermediate transmitting portion FA is 0.7 time as great as the outer radius of the marginal transmitting portion FB. Also, design is made such that the best focus position of the image by the beam of light transmitted through the intermediate transmitting portion FA is 3 μm toward the projection optical system side relative to the best focus position of the image by the beam of light transmitted through the marginal transmitting portion FB, but this may be realized by any one of FIGS. 10A and 12A to 12C. As shown in FIGS. 17A to 17C, it is seen that even by the use of the pupil filter member of FIG. 13A, there can be obtained an image having a great depth of focus which is a feature of the present invention.

Figure 20A:
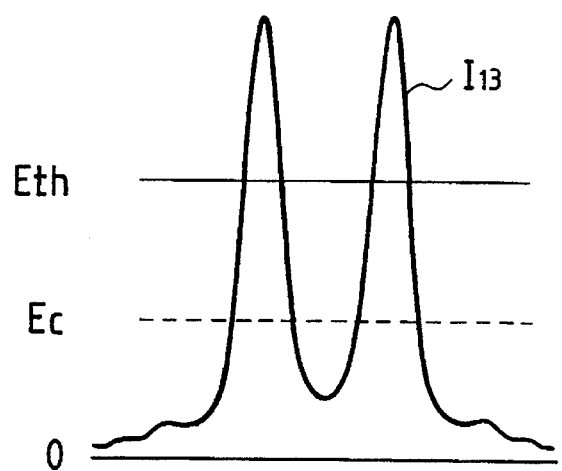
FIGS. 20A, 20B and 20C show the result of the simulation of the intensity distribution of the optical images of two contact hole patterns relatively close to each other.
Figure 20B:
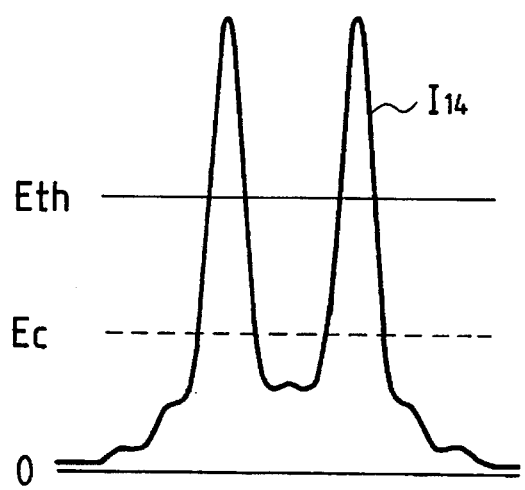
Figure 20C:
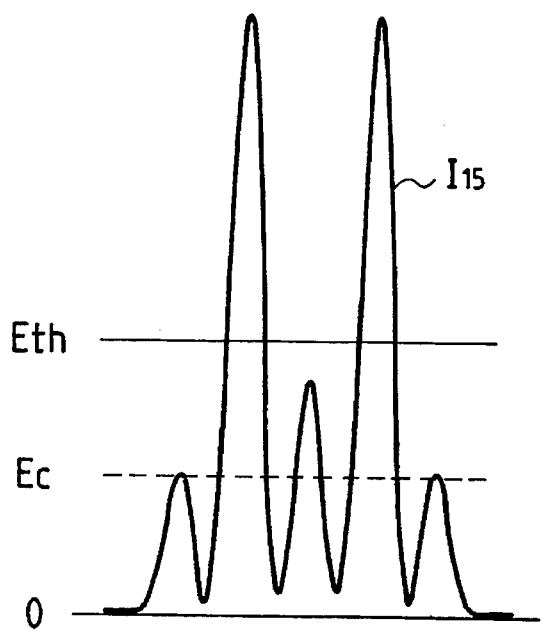

FIGS. 20A to 20C show the result of the simulation of the optical image (projected image) relative to a pattern in which two contact hole patterns are arranged relatively close to each other, and it is to be understood that both of the two contact hole patterns are 0.30 μm square and the central spacing therebetween is 1.05 μm. FIG. 20A shows an optical image $I_{13}$ at the best focus position under the same conditions as in the case of FIGS. 16A to 16C, and FIG. 20B shows an optical image $I_{14}$ at the best focus position under the same conditions as in the case of FIGS. 17A to 17C. The gains of the optical images $I_{13}$ and $I_{14}$ have been set such that in each of FIGS. 20A and 20B, the width at the exposure amount Eth is 0.3 μm. FIG. 20C shows the result of the simulation of an optical image $I_{15}$ when the prior-art Super-FLEX method is used, and the radius $r_1$ of the Super-FLEX type filter (double focus filter) here is 0.38 time as great as the radius $r_2$ of the pupil, and the phase of the transmitted light is shifted by π[rad] in the circular area within the radius $r_1$. The Super-FLEX type filter under this condition has its radius ratio optimized so as to maximize the depth of focus with respect to an isolated contact hole pattern, but as shown in FIG. 20C, for two relatively close contact hole patterns, the ringings (sub-peaks) of the two contact hole patterns overlap each other. As a result, the ringing exceeds an exposure amount Ec (an exposure amount for which positive type photoresist begins to decrease in film) and thus, an unnecessary pattern will be erroneously transferred to the photoresist.

Also, when use is made of a filter weaker in effect (smaller in radius $r_1$) than the Super-FLEX type filter used in FIG. 20C, the ringing can be made smaller than in FIG. 20C, but at the same time, the depth of focus improving effect by the filter becomes smaller and it becomes impossible to obtain a great depth of focus as in the present embodiment. On the other hand, in the optical images shown in FIGS. 20A and 20B, the ringing created around the image of the contact hole pattern is small and therefore, even if two ringings are combined together, there will be no fear that positive type photoresist is decreased in film.

In all of the above-described embodiments (simulations), the exposure wavelength is 0.365 μm, the numerical aperture NA of the projection optical system is 0.57 and the size of the contact hole pattern is 0.30 μm square, but the present invention can of course be used under whatever conditions. Also, it has been described that the best focus position by the beam of light transmitted through the transmitting portion FA is 3 μm (=2.67×λ/NA$^2$) more toward the projection optical system side than the best focus position by the beam of light transmitted through the transmitting portion FB, whereas this positional relation is not restrictive, but the best focus position by the beam of light transmitted through the transmitting portion FB may be on the projection optical system side. Also, if the spacing between the two best focus positions is of the order of 1.6 λ/NA$^2$ to 3.2 λ/NA$^2$, the effect of the present invention could be displayed sufficiently.

Also, although not shown in the above-described simulations, a good result equal to the above-described result of simulation can be obtained by the method as shown in FIGS. 10B and 10C wherein the best focus position is shifted by an optical path difference of λ/4. When for example, in FIG. 10B, the numerical aperture NA of the projection optical system is 0.57 and the radius $r_1$ of the transmitting portion FA is 0.65×$r_2$ and the radius $r_p$ of the phase shifter PS1 for giving a phase difference of λ/4 is 0.7×$r_1$, the radius $r_p$ will be as follows in an expression normalized by the numerical aperture NA of the projection optical system.

$$r_p = 0.57 \times 0.65 \times 0.75 = 0.26 \tag{10}$$

In this case, the expression of the wave front aberration by defocus generally used is as follows. In the expression below, ΔW is the wave front aberration and ΔF is the defocus amount.

$$\Delta W = (\tfrac{1}{2}) \Delta F \cdot NA^2 \tag{11}$$

From this expression and the phase difference λ/4 by the phase shifter PS1, the following expression is obtained:

$$\Delta W = \lambda/4 = (\tfrac{1}{2}) \Delta F \cdot NA^2 \tag{12}$$

From this expression, the defocus amount ΔF is as follows:

$$\Delta F = \lambda(2NA^2) \tag{13}$$

When in this expression (13), the radius $r_p$ of the phase shifter PS1 is used as the numerical aperture NA, ΔF=2.7 [μm]. That is, by the phase shifter PS1 for giving a phase difference of λ/4, in FIG. 10B, the best focus position of the central transmitting portion FA is about 27 μm more toward the projection optical system side than the best focus position of the marginal transmitting portion FB. Of course, the radius $r_p$ of the phase shifter PS1, etc. are not limited to this condition.

While each embodiment of the present invention and the effect thereof have been described above, a photoelectric detector for receiving part of the beam of light passed through the projection optical system may be provided on the wafer stage WST in order to judge the propriety of the particular direction of polarization of the illuminating light ILB to the reticle R when the illuminating light ILB is made to have that direction of polarization, or to judge the quality of the polarized state of the beam of imaging light after passed through the coherence reducing member CCM. Also when use is made of a reticle having a line and space pattern, the coherence reducing member CCM may be retracted out of the projection optical system PL and a part of the illuminating system may be made interchangeable so as to fit for SHRINC method. The coherence reducing member CCM may be used during the projection exposure of the contact hole pattern and a modified illuminating system for SHRINC method or a zonal illumination method may be used in combination therewith. In that case, when the reticle is to be interchanged from one for the contact hole to one for the line and space, the coherence reducing member CCM and the double focalizing member DFM may be retracted together. When the coherence reducing member CCM and the double focalizing member DFM are thus retracted, it is desirable that a transparent substrate (such as a quartz plate) having an optical thickness equal to that of the two members be inserted into the optical path so that the imaging state of the projection optical system may not change.

While the coherence reducing member CCM shown in each embodiment of the present invention is constituted by a circular or zonal transmitting portion or light intercepting portion, these shapes are not restrictive. For example, the circular transmitting portion or light intercepting portion may be modified into polygons including rectangle, and the zonal transmitting portion or light intercepting portion may be modified into a shape annularly surrounding the polygon.

Further, for example, in FIG. 15B, it has been understood that the boundaries between the central circular transmitting portion $FA_1$, the intermediate zonal transmitting portion FB and the marginal zonal transmitting portion $FA_2$ coincide with each other at the positions of the radii $r_1$ and $r_2$, respectively, but example, depending on the convenience or the like in the manufacture of the coherence reducing member, a light intercepting portion (zonal) may be provided at the boundary between adjacent areas. In such case, the wave front aberration by defocus shown in FIGS. 4 and 5 is further decreased by the light intercepting portions and therefore, the depth of focus increasing effect of the present invention can be further increased. In this case, the radii $r_1$ and $r_2$ can be considered to be intermediate of the respective light intercepting portions (zonal). By intercepting the vicinity of the optical axis in the central transmitting portion $FA_1$, it is also possible to further increase the depth of focus increasing effect as described above.

Thus, the present invention is not restricted to the above-described embodiments, but may assume various constructions without departing from the gist of the invention.

What is claimed is:

1. A projection exposure apparatus comprising:

an illuminating system for irradiating a mask with illuminating light;

a projection optical system for projecting the image of a pattern formed on said mask to a photosensitive substrate;

a first optical member for reducing the coherency between imaging light distributed in a first area comprising at least one of a circular area and an annular area centering around the optical axis of said projection optical system in or near an optical Fourier transform plane in said projection optical system for the pattern surface of said mask and imaging light distributed in a second area other than said first area in or near said Fourier transform plane; and a second optical member for making the in-focus position of the light passing through said first area and the in-focus position of the light passing through said second area differ by a predetermined amount in the direction of the optical axis of said projection optical system.

2. An apparatus according to claim 1, wherein said second optical member comprises an optical element in which the focal length of said first area and the focal length of said second area differ from each other.

3. An apparatus according to claim 1, wherein said second optical member comprises a phase difference member for making the phase of the illuminating light passing through an axis-symmetrical partial area in said first area centering around the optical axis of said projection optical system differ by the order of π/2 from the phase of the illuminating light passing through the other area than said partial area in said first area.

4. An apparatus according to claim 1, wherein said second optical member comprises a phase difference member for making the phase of the illuminating light passing through an axis-symmetrical partial area in said second area centering around the optical axis of said projection optical system differ by the order of π/2 from the phase of the illuminating light passing through the other area than said partial area in said second area.

5. An apparatus according to claim 1, wherein said first optical member comprises a polarized state varying member for setting the polarized state of the illuminating light transmitted through said first area and the polarized state of the illuminating light transmitted through said second area to a state in which they do not interfere with each other.

6. An apparatus according to claim 1, wherein said first optical member is an optical path difference member for giving an optical path difference equal to or greater than the coherent distance of said illuminating light to between the illuminating light transmitted through said first area and the illuminating light transmitted through said second area.

7. An apparatus according to claim 1, wherein when the amount of deviation in the direction of the optical axis of said projection optical system between the in-focus position of the light passing through said first area and the in-focus position of the light passing through said second area is $\Delta F_{12}$ and the numerical aperture of said projection optical system is NA and the wavelength of said illuminating light is $\lambda$, said amount of deviation $\Delta F_{12}$ satisfies the relation that $$1.6 \times \lambda/NA^2 \leq \Delta F_{12} \leq 3.2 \times \lambda/NA^2.$$

8. A projection exposure method comprising:

the step of disposing a mask having an isolated pattern on the object surface side of a projection optical system; and the step of disposing in said projection optical system a first optical member for reducing the coherency between imaging light distributed in a first area comprising at least one of a circular area and an annular area centering around the optical axis of said projection optical system in or near an optical Fourier transform plane in said projection optical system for the pattern surface of said mask, and a second optical member for making the in-focus position of the light passing through said first area and the in-focus position of the light passing through said second area differ by a predetermined amount in the direction of the optical axis of said projection optical system.

\* \* \* \* \*